US007529006B2

(12) United States Patent
Itagaki et al.

(10) Patent No.: US 7,529,006 B2
(45) Date of Patent: May 5, 2009

(54) IMAGE PROCESSING METHOD, IMAGE PROCESSING APPARATUS, STORAGE MEDIUM, AND PROGRAM FOR CALCULATING FIRST AND SECOND GRADUATION-CORRECTION CHARACTERISTICS, AND FOR REDUCING HUE VARIATIONS OF A SECONDARY COLOR

(75) Inventors: Tomohisa Itagaki, Ohta-ku (JP); Jiro Ishizuka, Ohta-ku (JP); Nobuatsu Sasanuma, Ohta-ku (JP); Nobuhiko Zaima, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 856 days.

(21) Appl. No.: 10/742,203

(22) Filed: Dec. 18, 2003

(65) Prior Publication Data

US 2004/0131371 A1 Jul. 8, 2004

(30) Foreign Application Priority Data

Dec. 24, 2002 (JP) ............................ 2002/373039

(51) Int. Cl.
*G03F 3/08* (2006.01)
*H04N 1/60* (2006.01)

(52) U.S. Cl. ........................ 358/519; 358/1.9; 358/518

(58) Field of Classification Search ................. 358/1.9, 358/1.15, 504, 518, 520, 500, 501, 519, 521, 358/523, 1.1, 505, 515, 530, 534; 399/27, 399/28, 30, 38, 39, 40, 41, 49, 53, 54; 347/19, 347/131; 382/132, 137, 254, 162, 167, 274; 348/255, 256, 603, 645, 649, 652, 655, 254, 348/703

See application file for complete search history.

(56) References Cited

U.S. PATENT DOCUMENTS

| | | | | |
|---|---|---|---|---|
| 5,194,891 | A * | 3/1993 | Gan | 355/38 |
| 5,781,206 | A * | 7/1998 | Edge | 347/19 |
| 6,178,007 | B1 * | 1/2001 | Harrington | 358/1.9 |
| 6,184,915 | B1 | 2/2001 | Atsumi et al. | |
| 6,204,873 | B1 * | 3/2001 | Shimazaki | 347/172 |

(Continued)

FOREIGN PATENT DOCUMENTS

JP 10-28229 1/1998

(Continued)

*Primary Examiner*—King Y Poon
*Assistant Examiner*—Peter L Cheng
(74) *Attorney, Agent, or Firm*—Cannon USA Inc IP Division

(57) ABSTRACT

An image processing apparatus for forming an image using at least three color materials includes a first generation device for generating a plurality of patches of secondary colors composed of color materials of two different colors; a first measurement device for measuring the patches; a first correction characteristic calculation device for calculating gradation-correction characteristics corresponding to each of the two color materials; a second generation device for generating a group of patches in accordance with an image signal for the two different color materials and an image signal for color materials other than the two color materials by using an image signal corrected on the basis of the gradation-correction characteristics; a second measurement device for measuring patches generated by the second generation device; and a second correction characteristic calculation device for calculating gradation-correction characteristics of image signals for color materials other than the two different materials.

7 Claims, 15 Drawing Sheets

U.S. PATENT DOCUMENTS

| | | | | |
|---|---|---|---|---|
| 6,697,167 | B1 | 2/2004 | Takahashi | |
| 7,023,584 | B2 * | 4/2006 | Cowan et al. | 358/1.9 |
| 7,092,122 | B2 | 8/2006 | Iwaki | |
| 7,292,370 | B2 | 11/2007 | Iwaki | |
| 2002/0080379 | A1 | 6/2002 | Iwaki | |
| 2004/0095591 | A1 | 5/2004 | Takahashi | |
| 2005/0259286 | A1 | 11/2005 | Iwaki | |

FOREIGN PATENT DOCUMENTS

| | | | |
|---|---|---|---|
| JP | 11-75067 | | 3/1999 |
| JP | 2002-051225 | A | 2/2002 |
| JP | 2002-152529 | A | 5/2002 |
| JP | 2002-247399 | A | 8/2002 |

* cited by examiner

| | | | | | | | | | | | | | | | | | | | | | | |
|---|---|---|---|---|---|---|---|---|---|---|---|---|---|---|---|---|---|---|---|---|---|---|
| 30 | | | | | | | | | | | | | | | 26 | 30 | | 82 | 86 | 90 | 94 | 98 |
| 28 | | | | | | | | | | | | | | 24 | 28 | 32 | | 84 | 88 | 92 | 96 | 100 |
| 26 | | | | | | | | | | | | | 22 | 26 | 30 | 34 | | 86 | 90 | 94 | 98 | 102 |
| 24 | | | | | | | | | | | | 20 | 24 | 28 | 32 | 36 | | 88 | 92 | 96 | 100 | 104 |
| 22 | | | | | | | | | | | 18 | 22 | 26 | 30 | 34 | 38 | | 90 | 94 | 98 | 102 | 106 |
| 20 | | | | | | | | | | 16 | 20 | 24 | 28 | 32 | 36 | 40 | | 92 | 96 | 100 | 104 | 108 |
| 18 | | | | | | | | | 14 | 18 | 22 | 26 | 30 | 34 | 38 | 42 | | 94 | 98 | 102 | 106 | 110 |
| 16 | | | | | | | | 12 | 16 | 20 | 24 | 28 | 32 | 36 | 40 | 44 | | 96 | 100 | 104 | 108 | 112 |
| 14 | | | | | | | 10 | 14 | 18 | 22 | 26 | 30 | 34 | 38 | 42 | 46 | | 98 | 102 | 106 | 110 | 114 |
| 12 | | | | | | 8 | 12 | 16 | 20 | 24 | 28 | 32 | 36 | 40 | 44 | 48 | | 100 | 104 | 108 | 112 | 116 |
| 10 | | | | | 6 | 10 | 14 | 18 | 22 | 26 | 30 | 34 | 38 | 42 | 46 | 50 | | 102 | 106 | 110 | 114 | 118 |
| 8 | | | | 4 | 8 | 12 | 16 | 20 | 24 | 28 | 32 | 36 | 40 | 44 | 48 | 52 | | 104 | 108 | 112 | 116 | 120 |
| 6 | | | 2 | 6 | 10 | 14 | 18 | 22 | 26 | 30 | 34 | 38 | 42 | 46 | 50 | 54 | | 106 | 110 | 114 | 118 | 122 |
| 4 | | | 4 | 8 | 12 | 16 | 20 | 24 | 28 | 32 | 36 | 40 | 44 | 48 | 52 | 56 | | 108 | 112 | 116 | 120 | 124 |
| 2 | | 2 | 6 | 10 | 14 | 18 | 22 | 26 | 30 | 34 | 38 | 42 | 46 | 50 | 54 | 58 | | 110 | 114 | 118 | 122 | 126 |
| 0 | 0 | 4 | 8 | 12 | 16 | 20 | 24 | 28 | 32 | 36 | 40 | 44 | 48 | 52 | 56 | 60 | | 112 | 116 | 120 | 124 | 128 |

TARGET LUMINANCE INFORMATION AND GRADATION CHARACTERISTICS WHEN LUT IS OFF

| | OPERATING STATE | OUTPUT INFORMATION | | | | SIGNAL PATH |
|---|---|---|---|---|---|---|
| | | SW1 | PG | SW2 | LUT | |
| 1 | NORMAL | ON | OFF | OFF | ON | SW1-LUT-PWM |
| 2 | CALIBRATION STEP 1 | OFF | ON | ON | OFF | PG-SW2-PWM |
| 3 | CALIBRATION STEP 2 | OFF | ON | C, K ; ON<br>M, Y ; OFF | M, Y ; ON<br>C, K ; OFF | MY ; PG-LUT-PWM<br>CK ; PG-SW2-PWM |

FIG. 14

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| Y+6 | 10 | 16 | 21 | 26 | 30 | 36 | 41 | 46 | 51 | 56 | 63 | 69 | 76 | 83 | 91 | 105 | 116 | 129 | 139 | 151 | 166 | 176 | 191 | 201 | 214 | 222 | 233 | 239 | 249 | 253 | 254 | |
| M | 6 | 12 | 16 | 23 | 26 | 31 | 36 | 41 | 46 | 51 | 55 | 60 | 66 | 72 | 80 | 88 | 94 | 100 | 110 | 123 | 134 | 155 | 170 | 183 | 197 | 208 | 223 | 230 | 242 | 246 | 249 | |
| Y+4 | 8 | 14 | 19 | 24 | 28 | 34 | 39 | 44 | 49 | 54 | 61 | 67 | 74 | 81 | 89 | 103 | 114 | 127 | 137 | 149 | 164 | 174 | 189 | 199 | 212 | 220 | 231 | 237 | 247 | 251 | 252 | |
| M | 6 | 12 | 16 | 23 | 26 | 31 | 36 | 41 | 46 | 51 | 55 | 60 | 66 | 72 | 80 | 88 | 94 | 100 | 110 | 123 | 134 | 155 | 170 | 183 | 197 | 208 | 223 | 230 | 242 | 246 | 249 | |
| Y+2 | 6 | 12 | 17 | 22 | 26 | 32 | 37 | 42 | 47 | 52 | 59 | 65 | 72 | 79 | 87 | 101 | 112 | 125 | 135 | 147 | 162 | 172 | 187 | 197 | 210 | 218 | 229 | 235 | 245 | 249 | 250 | |
| M | 6 | 12 | 16 | 23 | 26 | 31 | 36 | 41 | 46 | 51 | 55 | 60 | 66 | 72 | 80 | 88 | 94 | 100 | 110 | 123 | 134 | 155 | 170 | 183 | 197 | 208 | 223 | 230 | 242 | 246 | 249 | |
| Red INPUT SIGNAL | 8 | 16 | 24 | 32 | 40 | 48 | 56 | 64 | 72 | 80 | 88 | 96 | 104 | 112 | 120 | 128 | 136 | 144 | 152 | 160 | 168 | 176 | 184 | 192 | 200 | 208 | 216 | 224 | 232 | 240 | 248 | 255 |
| Y | 4 | 10 | 15 | 20 | 24 | 30 | 35 | 40 | 45 | 50 | 57 | 63 | 70 | 77 | 85 | 99 | 110 | 123 | 133 | 145 | 160 | 170 | 185 | 195 | 208 | 216 | 227 | 233 | 243 | 247 | 246 | 255 |
| M | 6 | 12 | 16 | 23 | 26 | 31 | 36 | 41 | 46 | 51 | 55 | 60 | 66 | 72 | 80 | 88 | 94 | 100 | 110 | 123 | 134 | 155 | 170 | 183 | 197 | 208 | 223 | 230 | 242 | 246 | 249 | 255 |
| Y | 4 | 10 | 15 | 20 | 24 | 30 | 35 | 40 | 45 | 50 | 57 | 63 | 70 | 77 | 85 | 99 | 110 | 123 | 133 | 145 | 160 | 170 | 185 | 195 | 208 | 216 | 227 | 233 | 243 | 247 | 248 | |
| M+2 | 8 | 14 | 18 | 25 | 28 | 33 | 38 | 43 | 48 | 53 | 57 | 62 | 68 | 74 | 82 | 90 | 96 | 102 | 112 | 125 | 136 | 157 | 172 | 185 | 199 | 210 | 225 | 232 | 244 | 248 | 251 | |
| Y | 4 | 10 | 15 | 20 | 24 | 30 | 35 | 40 | 45 | 50 | 57 | 63 | 70 | 77 | 85 | 99 | 110 | 123 | 133 | 145 | 160 | 170 | 185 | 195 | 208 | 216 | 227 | 233 | 243 | 247 | 248 | |
| M+4 | 10 | 16 | 20 | 27 | 30 | 35 | 40 | 45 | 50 | 55 | 59 | 64 | 70 | 76 | 84 | 92 | 98 | 104 | 114 | 127 | 138 | 159 | 174 | 187 | 201 | 212 | 227 | 234 | 246 | 250 | 253 | |
| Y | 4 | 10 | 15 | 20 | 24 | 30 | 35 | 40 | 45 | 50 | 57 | 63 | 70 | 77 | 85 | 99 | 110 | 123 | 133 | 145 | 160 | 170 | 185 | 195 | 208 | 216 | 227 | 233 | 243 | 247 | 248 | |
| M+6 | 12 | 18 | 22 | 29 | 32 | 37 | 42 | 47 | 52 | 57 | 61 | 66 | 72 | 78 | 88 | 94 | 100 | 106 | 116 | 129 | 140 | 161 | 176 | 189 | 203 | 214 | 229 | 236 | 248 | 252 | 255 | |

IMAGE PROCESSING METHOD, IMAGE PROCESSING APPARATUS, STORAGE MEDIUM, AND PROGRAM FOR CALCULATING FIRST AND SECOND GRADUATION-CORRECTION CHARACTERISTICS, AND FOR REDUCING HUE VARIATIONS OF A SECONDARY COLOR

BACKGROUND OF THE INVENTION

1. Field of the Invention

The present invention relates to an image processing method capable of improving color reproducibility, an image processing apparatus therefor, a storage medium therefor, and a program therefor.

2. Description of the Related Art

Some recent copying machines have been used as MFPs (Multi Function Printers), together with printers, by being connected to a network.

In recent years, color matching of printed images between devices connected to a network, or color matching of the color of images displayed on a display device, such as a CRT, and the color of printed images is often performed. Various color management methods for that purpose are known. For example, in color management using ICC (International Color Consortium) profiles, calibration (also called color matching, or characterization) is performed by creating a device ICC profile unique to a printer, a copying machine, or the like. For example, by performing color conversion by personal computer (PC) in order to generate print data and by outputting this print data to a device corresponding to the profile, color matching of the color of the printed image and the color of an image displayed on a display device, etc., becomes possible. Since software and colorimeters for creating profiles are commercially available for general users, an environment in which the color output by an image forming apparatus such as a printer is made to match the target color is becoming available. As another calibration method, calibration in which the contents of a gamma LUT regarding gradation characteristics are changed to obtain desired gradation characteristics without using color conversion based on a multi-dimensional LUT of an ICC profile has been performed.

As described above, color management is an effective method because the difference of output colors between a plurality of devices of the same type and different types can be reduced; however, the range of application is not limited to the foregoing and includes the case where, for example, a printer is used for color calibration by causing the printed color to match the color to be printed by an offset printer. If the ICC profiles for one printing device and a printer are provided, color management such as that shown in, for example, FIG. 15 becomes possible with PC application software.

As shown in FIG. 15, the contents of an ICC profile for printing and an ICC profile for a printer are each calibrated in such a manner as to correspond to, for example, the CIE L*a*b* color space (CIE is the abbreviation of Commission Internationale d'Eclairage), which is a color space that is not dependent on a printer on the basis of the color measurement of patches by using a calorimeter. As a result, it is possible to cause the color to be printed by a printing device and the color printed by a printer to match each other. Then, it becomes possible for the color management module (CMM) to generate print data by performing color conversion using these profiles.

As described above, since a color management environment for calorimeters, application software, profile creation software, etc., is available, image forming apparatuses of an electrophotographic method are increasingly used for color calibration of printing devices in the manner described above in the design industry.

On the other hand, color adjustment for copying machine engines will now be described. In order to make density and gradation reproducibility of copied images and printed images uniform, it is necessary to make corrections by adjusting the following variations:

(1) Short-term variations resulting from variations in the device environment; and (2) Long-term variations resulting from changes over time of a photosensitive member and a developing agent.

As a specific method, as described in Japanese Unexamined Patent Applications Publication Nos. 10-28229 and 11-75067, first, a test print is formed, a correction coefficient of a contrast potential for forming an image is optimized on the basis of the obtained density information, and a grid voltage and a development bias voltage are set so as to obtain a desired maximum contrast. After this setting, a single-color gradation patch is output, the density is calculated by a reader section, and a one-dimensional LUT (gradation correction table) is generated to form desired targets (density linearity, lightness linearity, etc.).

However, even when the gradation correction of the above-mentioned single-color one-dimensional (C, M, Y) is performed, there are cases in which gradation characteristics of a secondary color (R, G, B) vary due to environmental conditions, variations in the transfer efficiency of a paper type, the degree of deterioration of a fixing roller, or the like. FIG. 6 shows CIE (Commission Internationalde l'Eclairage) chromaticity coordinates (a*b*space) showing gradation characteristics of a secondary color and a primary color, which are output after single-color gradation correction. As shown in FIG. 6, even if a secondary color equal-amount signal (for example, a signal having Y and M levels of 30% and 30%) is input, output is performed such that the hue angle of the image formed as a result of the above varies.

As described above, there are many matters to be considered, such as the red gradation which is often used in DTP (Desk Top Publishing) not being output correctly, and the smoothness of flesh-color portions and the color matching accuracy being low due to variations of the hue angle of the secondary color image formed.

Furthermore, chroma spacing of single color (primary color) is maintained constant by single-color gradation correction, and single-color gradation characteristics are preferable; however, hue variations of the secondary color occur as in the above-described problem. When the visual-angle differential limen is taken into consideration, greater importance should be placed on hue than chroma, since hue-angle variations of the secondary color are more conspicuous than chroma variations of a single color. Therefore, there have been demands for gradation correction in which greater importance is placed on the hue angle.

SUMMARY OF THE INVENTION

The present invention has been made in view of the above-described problems. An object of the present invention is to achieve further improvement of color matching accuracy and further improvement of gradation reproduction by performing gradation correction for reducing hue variations of a secondary color image formed.

To achieve the above-mentioned object, in one preferred aspect, the present invention provides an image processing apparatus for forming an image using at least three color materials including first generation means for generating a plurality of patches of secondary colors composed of color materials of two different colors; first measurement means for measuring the patches; first correction characteristic calculation means for calculating gradation-correction characteristics corresponding to each of the two color materials such that the secondary colors are in a predetermined relationship on the basis of the measured results of the patches; second generation means for generating a group of patches in accordance with an image signal for the two different color materials and an image signal for color materials other than the two color materials by using an image signal corrected on the basis of the gradation-correction characteristics; second measurement means for measuring patches generated by the second generation means; and second correction characteristic calculation means for calculating gradation-correction characteristics of image signals for color materials other than the two different color materials on the basis of the measured results of the second measurement means.

Another object of the present invention is to provide a novel color reproduction method.

Further objects, features and advantages of the present invention will become apparent from the following description of the preferred embodiments with reference to the attached drawings.

BRIEF DESCRIPTION OF THE DRAWINGS

FIG. 14 shows the concept, used thus far, for forming a matrix patch by using gradation correction coefficients of an LUT according to a fifth embodiment of the present invention.

DESCRIPTION OF THE PREFERRED EMBODIMENTS

The preferred embodiments of the present invention will now be described below with reference to the drawings.

First Embodiment (Description of the Image Forming Apparatus of the First Embodiment)

Figure 1:
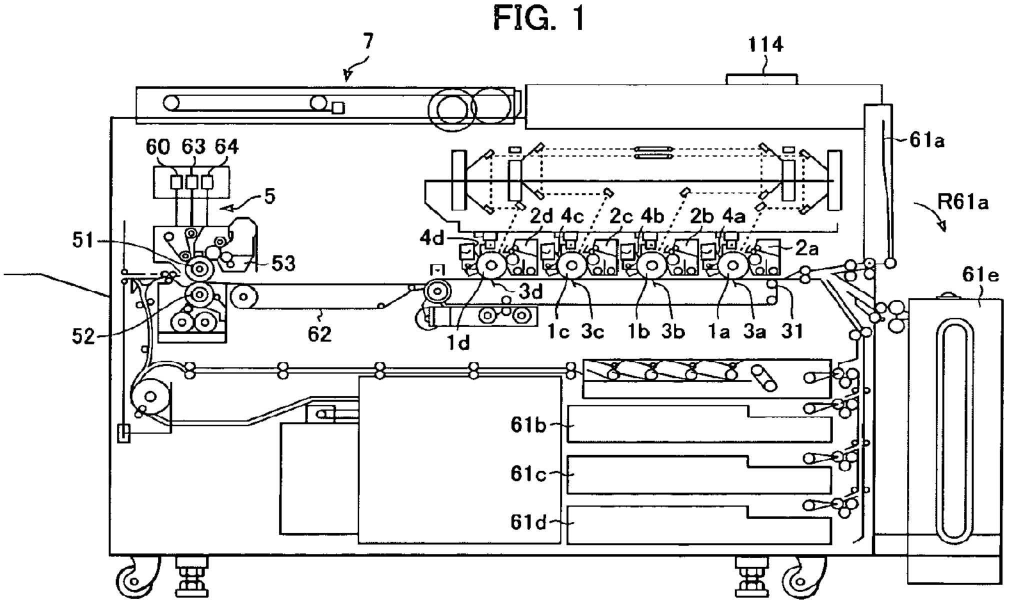
FIG. 1 schematically shows an image forming apparatus according to an embodiment of the present invention.

FIG. 1 schematically shows the configuration of a full-color laser beam printer using four colors, which is an image forming apparatus according to this embodiment.

The laser beam printer shown in FIG. 1 is provided with four image forming stations, forming the respective colors magenta, cyan, yellow, and black. Each image forming station includes an electrophotographic photosensitive member (hereinafter referred to as a "photosensitive drums") 1*a*, 1*b*, 1*c*, and 1*d*, which are image carriers that are supported rotatably. The image forming stations further include chargers above the photosensitive drums, development devices 2*a*, 2*b*, 2*c*, and 2*d*, cleaners 4*a*, 4*b*, 4*c*, and 4*d* in this sequence, and the like along the direction of the rotation.

Below the photosensitive members 1*a*, 1*b*, 1*c*, and 1*d* between the development device 2*a*, 2*b*, 2*c*, and 2*d* and the cleaners 4*a*, 4*b*, 4*c*, and 4*d*, a transfer belt 31 is provided in such a manner as to be in contact with the above. The transfer belt 31 feeds recording paper P, which is a recording medium, to each of the photosensitive drums 1*a*, 1*b*, 1*c*, and 1*d* in sequence. In each image forming station, the image formed on the photosensitive drums 1*a*, 1*b*, 1*c*, and 1*d* is transferred onto the recording paper P on the transfer belt 31 by transfer chargers 3*a*, 3*b*, 3*c*, and 3*d*.

In addition, the laser beam printer is provided with a plurality of paper-supply sections, that is, paper-supply cassettes 61*b*, 61*c*, and 61*d*, and a manual-feed paper tray 61*a* which can be pulled out in the direction of the arrow R61*a*, and a large-capacity paper deck 61*e* wherein recording paper P is loaded.

A toner image of each color formed on the photosensitive drums 1*a*, 1*b*, 1*c*, and 1*d* is transferred onto the recording paper P in sequence during the process of passing each image forming station while being supported on the transfer belt 31. When this transfer step is completed, the recording paper P is separated from the transfer belt 31 and is transported to a fixing device 5 by a transport belt 62 serving as recording paper guide means.

The fixing device 5 includes a fixing roller 51 which is rotatably supported, a pressure application roller 52 which rotates in pressure contact with this fixing roller 51, a mold-release-agent coating device 53 which is a mold release agent supply and coating means, and a roller cleaning device. A heater, such as a halogen lamp, is disposed inside each of the fixing roller 51 and the pressure application roller 52. A thermistor (not shown) is brought into contact with each of the fixing roller 51 and the pressure application roller 52, so that surface temperature adjustment of the fixing roller 51 and the pressure application roller 52 is performed by controlling the voltage to be applied to each heater via a temperature adjustment device (not shown). The pressure application value of the pressure application roller 52 and the surface temperature of the fixing roller can be made variable by a fixing control mechanism 60.

A mold-release-agent coating device 53 for coating silicon oil functioning as a mold release agent is in contact with the surface of the fixing roller 51, so that, when the recording paper P is transported by the transport belt 62 and is passed between the fixing roller 51 and the pressure application roller 52, the toner does not adhere to the surface of the fixing roller 51. Furthermore, a coating-amount control device 63 for controlling the amount of coating of silicon oil to be coated on the surface of the fixing roller 51 is connected to the mold-release-agent coating device 53.

A speed control device 64 for controlling the transport speed of the recording paper P, that is, the rotation speed of the fixing roller 51 and the pressure application roller 52 for applying pressure and heating the obverse and reverse surfaces of the recording paper P, is connected to the driving motor (not shown) for driving the fixing roller 51 and the pressure application roller 52. As a result, the non-fixed toner on the surface of the image recording paper P melts and is fixed, and thus a full-color image is formed on the recording paper P. The recording paper P on which this full-color image is fixed is separated from the pressure application roller 52 by a separation claw (not shown).

Reference numeral 7 denotes a manuscript reading section, which obtains an image signal of each color by optically scanning and reading a manuscript placed on the manuscript holder. Reference numeral 114 denotes an operation display of a touch-panel configuration of a laser beam printer, through which commands are input from an operator and the status of the device is reported to the operator.

(Gradation Correction Method of the First Embodiment)

The gradation correction method used in this embodiment will now be described.

An image forming signal of a secondary-color matrix gradation patch (64×64 gradations) of yellow and magenta is output in the state of an engine in which a LUT (look-up table) is off, that is, gradation correction is not performed on the input signal in accordance with the instruction of starting gradation correction by the operator from the operation display. This secondary color matrix patch does not cover all matrixes (secondary color images) of 64×64, the features thereof are a thinned-out matrix patch shown in FIGS. 2A and 2B. That is, in spite of the fact that 64×64=4096 patches are necessary, 2047 patches are used. The 2047 patches are formed such that the pattern of 41×50 patches is divided into two portions and two of 41×25 patches are arrayed so as to be contained on paper of an A3 size, each patch contained in a square of 7 mm.

Figure 2A:
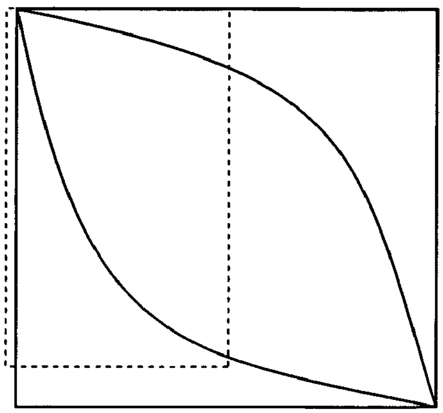
FIGS. 2A and 2B show the concept of matrix patches for a secondary color, on which importance is placed, during calibration according to the embodiment of the present invention.
Figure 2B:
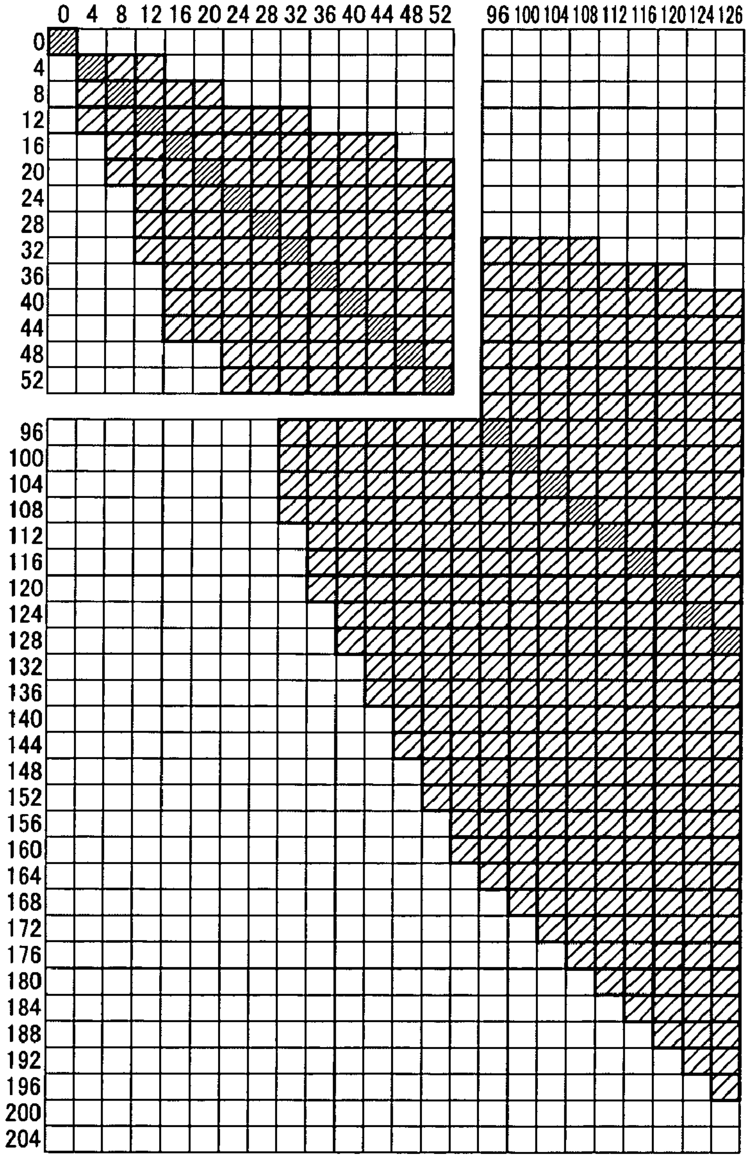

FIG. 2A shows the thinning-out type of the above-described thinned-out matrix patch when the upper left corner portion is the origin, and, for example, 64-step gradations of yellow are plotted in the horizontal axis and 64-step gradations of magenta are plotted in the vertical axis. In FIG. 2A, only the patch of the area sandwiched between the two arcs is output. FIG. 2B shows details of the portion surrounded by the dotted-line square in FIG. 2A, and the patches within the thick square frame shown in FIG. 2A are output (contained in the 2047 patches). However, some portions are omitted in FIG. 2B.

The reason why such patches of matrix are formed is that the matrix output for this time is an output for maintaining the constant hue of red, which is a secondary color. For example, the possibility that a combination of signals of Y 100% and M 10% becomes the gradation of the red hue is very low, and even if it is omitted, no influence is exerted because a constant hue of red is set to be maintained. In practice, when the inventors verified assuming various experiment parameters, such as environmental variations, endurance deterioration, image processing pattern (dither), they determined that thinning-out of the above-mentioned degree is possible. Of course, a larger number of patches may be output by considering accuracy, engine characteristics, etc. Furthermore, from the viewpoint of the amount of toner consumption, of course, the number of patches may be decreased.

The secondary-color matrix patch which is output onto the recording paper in the above-described way is placed on the reader section, the image is read, and the chromaticity of each patch is calculated.

The reader section is used during normal copying, and converts luminance information of RGB into L*a*b* chromaticity information (to be described later) by a chromaticity calculation mechanism. In the conversion method, a three-dimensional direct mapping of RGB→L*a*b* (similar to the ICC profile) is employed, and chromaticity is calculated.

For the measured data of the secondary color matrix patch, in which L*a*b* is calculated, in order to determine gradation characteristics of red, the hue angle and the chroma of each patch are calculated. The method of calculating the hue angle and the chroma is described below.

The hue angle h can be represented by an angle θ formed by the chromaticity coordinates a* and b*. The hue angle h is 0° when (a*, b*)=(+X, 0), is 180° when (a*, b*)=(−X, 0), is 90° when (a*, b*)=(0, +X), and is 270° when (a*, b*)=(0, −X). When this is represented by equations, $$(a^*, b^*)=(+X, 0)\rightarrow h(\text{hue angle})=0,$$

$$0<a^*, 0<b^*\rightarrow h(\text{hue angle})=\arctan(b^*/a^*),$$

$$(a^*, b^*)=(0, +X)\rightarrow h(\text{hue angle})=90,$$

$$a^*<0, 0<b^*\rightarrow h(\text{hue angle})=180+\arctan(b^*/a^*),$$

$$(a^*, b^*)=(-X, 0)\rightarrow h(\text{hue angle})=180,$$

$$a^*<0, b^*<0\rightarrow h(\text{hue angle})=180+\arctan(b^*/a^*),$$

$$(a^*, b^*)=(0, -X)\rightarrow h(\text{hue angle})=270,$$

$$0<a^*, b^*<0\rightarrow h(\text{hue angle})=360+\arctan(b^*/a^*), \text{ and}$$

$$(a^*, b^*)=(0, 0)\rightarrow h(\text{hue angle})=0.$$

The chroma is a distance between two points from the center (a*, b*)=(0, 0) of the a*−b* plane. That is, chroma(C) =(a*^2+b*^2)^0.5.

The secondary-color gradation characteristics are determined by referring to the hue angle information and the chroma information indicating which hue angle and chroma L*, a*, and b* corresponding to each patch determined in this manner have and the corresponding relationship with respect to the input image signal of each patch.

For this determination, first, the measured results of the patch image of the levels of Y 100% and M 100% at which the maximum chroma is produced in this matrix are extracted, and the hue angle and the chroma of the patch are determined.

Next, a patch is detected which is within ±2° with respect to the determined hue angle (the hue angle calculated from the measured value of the patch image of the levels of Y 100% and M 100%). The combination of the patches of Y and M within the hue angle ±2° causes the gradation of red (YM equal-amount signal) to be reproduced.

Figure 3:
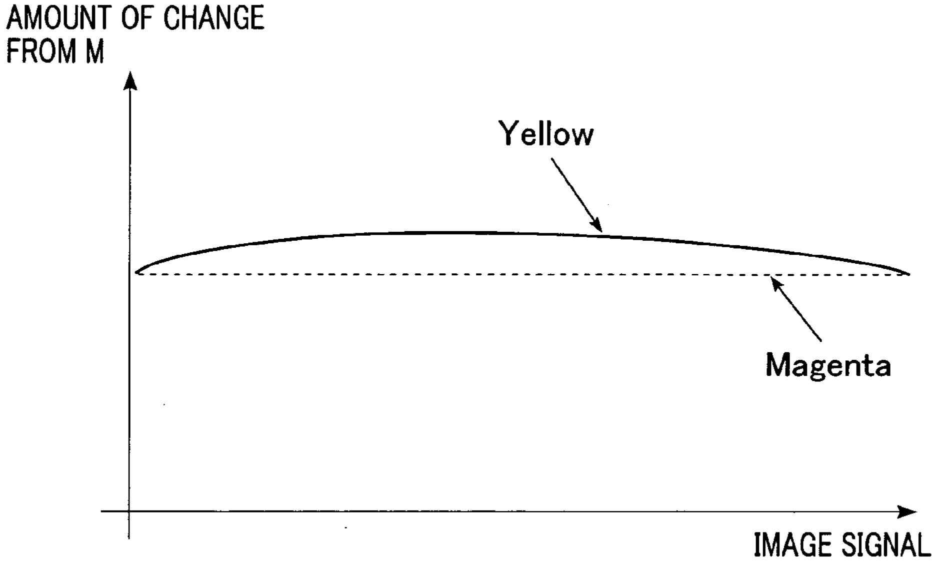
FIG. 3 shows the tendency for a Y signal to change relative to an M signal after R gradation correction according to the first embodiment.

FIG. 3 shows the ratio of the level of magenta to that of yellow in the image signal by which each patch which is detected in the above-described manner is formed. In FIG. 3, the horizontal axis indicates the image signal level, and the vertical axis indicates the yellow level when the magenta signal level is used as a reference, and also, FIG. 3 shows the situation in which the yellow level changes from the magenta level. Naturally, the amount of change is 0 for magenta, and the features are that the image signal of yellow is 0 or more in all areas when compared to the image signal of magenta. However, this result greatly changes depending on the type of toner, fixing device, image processing pattern, etc., and there is no novelty in that the number of Y gradations becomes greater than the number of M gradations.

In the foregoing, a combination of yellow and magenta (combinations of the respective levels) for reproducing the hue of red is determined. Next, a determination as to which gradation characteristics these combinations should be output with needs to be made.

In this embodiment, "chroma linearity" is adopted. Chroma linearity represents gradation characteristics such that the change of chroma becomes linear with respect to the change of the input image signal.

By using a group of detected patches (within ±2°), with respect to the input signal (YM equal-amount signal, that is, YM same-level signal), a function for performing a conversion so that output chroma of the image (onto the recording paper) formed in accordance with this input signal (onto the recording paper) becomes linear is calculated. The relationship between the function (gradation-correction characteristics) obtained thereby, that is, the input image signal as a variable of the function, and the function value, that is, the output image signal for producing an output image to be formed, is shown in the graph such as that shown in FIG. 4.

Figure 4:
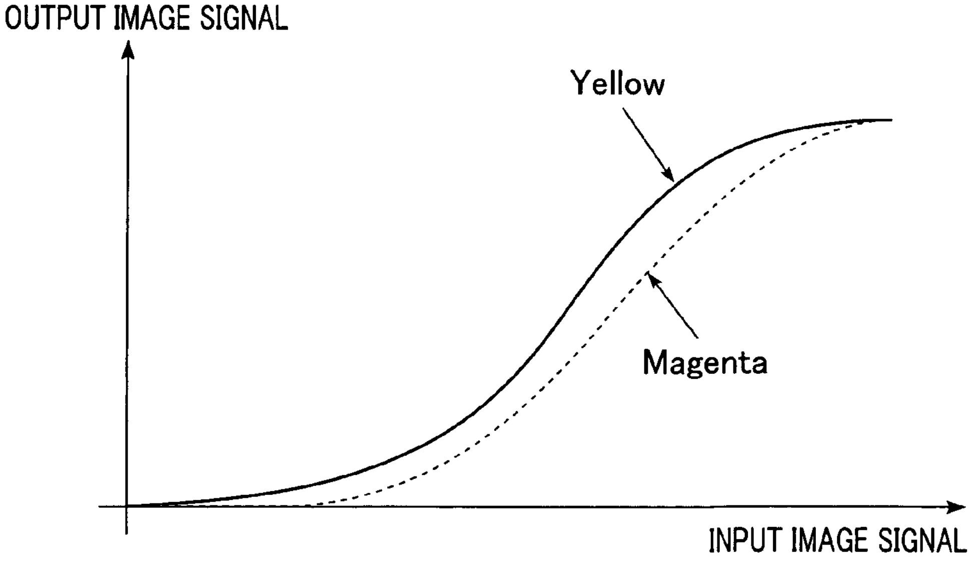
FIG. 4 shows conversion characteristics of M and Y LUTs after R gradation correction according to the first embodiment of the present invention.

FIG. 4 shows conversion characteristics, in which the horizontal axis indicates the input image signal level, and the vertical axis indicates the image signal level for producing an output image to be formed, that is, conversion characteristics of a LUT (look-up table) for signal level conversion (gradation correction). This is a graph in which, for example, when a red signal (the amounts of Y and M are equal) is input, the amounts of Y and M to be output are shown. For a signal area without a corresponding patch, calculations are performed by performing linear interpolation computation. Since this conversion table is designed so that the chroma of red becomes linear, when a signal of R 50% (levels of Y and M are 50%) is input, an image of chroma, which is positioned just at the middle from the chroma of the base (paper) to the maximum chroma of red, is formed.

On the other hand, the gradation correction of cyan will be described. A patch of cyan of the determined gradation of red, that is, mutually different gradations, is superimposed onto a plurality of patches which are formed at the equal amount of Y and M, the level of cyan is detected such that the chroma indicated by the measured value of the patch image formed thereby, that is, the patch image of the secondary color composed of the color materials of three colors becomes gray, and corrections are performed so that the levels equal to the levels of Y and M are converted into the detected levels. A description will be given below in detail.

A matrix patch is output by a method substantially similar to that when red gradation characteristics are determined. For this time, the gradation of red is formed using a signal such that the signal with an equal amount of Y and M is subjected to gradation correction (the LUTs of Y and M are on) by using the gradation correction coefficient (characteristics) determined in the above-described manner, and further, a matrix patch is output in a format in which a plurality of patches which form 64 gradations of cyan before gradation correction are superimposed onto a plurality of patches of the gradations of red.

As a matrix patch for this case, a thinned-out patch is used in a manner similar to that when patches of red are created. The gradation characteristics of red has been subjected to gradation correction, and thus, it is easy to predict which degree of chromaticity each patch image has. The processing performed herein is a verification as to which degree of cyan should be mixed to produce an achromatic color with respect to the gradation of red, and there is no need to change red. Therefore, 1586 patches, which is smaller than that when gradation characteristics of red (yellow and magenta) are determined, are used.

Figures 5A, 5B:
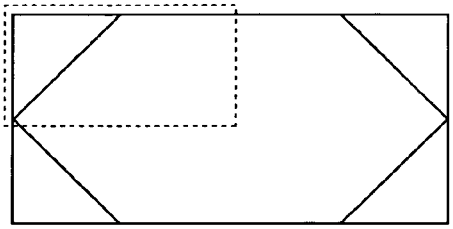
FIGS. 5A and 5B show the relationship between red gradation and a cyan matrix patch according to the first embodiment of the present invention.

The patch conceptual view at this time is shown in FIGS. 5A and 5B. FIG. 5A shows a square including a matrix of patches which are arranged in such a manner that, with respect to each red gradation patch, the basic red gradation is changed in the horizontal direction, the same red gradation is arrayed in the vertical direction, and the level of cyan is changed in units of two levels in the range of ±30 with respect to the level of the red patch, and also show the range of patches to be output by using an oblique-line portion. The details of the dotted-line portion of the square of this figure are shown in FIG. 5B. The numerals (0 to 30 are shown in the figure) on the left in FIG. 5B shows the signal levels of cyan (0 to 255) for generating patches, wherein portions are omitted in the direction. The numerals in the horizontal row, indicated by 0 at the left end of FIG. 5B, indicate the signal level of red, in other words, the signal levels of Y and M. As one example, it is shown that the sequence of numerals (10, 12, 14, 16, 18, 20, 22, 24) of the seventh vertical column from the left end indicates that a signal of a patch in which the signal levels of cyan a total of 15 levels between 10 to 24, or 24 to 38 (not shown), with respect to the signal level 24 of red, is generated. Therefore, it is shown in FIGS. 5A and 5B that, for the signal level of each patch, the red level is changed in the horizontal direction, for example, the cyan level is changed in the right downward direction, i.e., in the horizontal and vertical direction.

Next, the image which forms these matrix patches which are output onto the recording paper is read by the reader section, and the image is converted into chromaticity information (L*a*b*), that is, chroma and hue.

At this time, a group of patches, which is within a chroma value of 5, are detected so that three-color gray (achromatic color) is formed. As a result of this process, the gradation value of cyan is determined with respect to the red signal (YM equal-amount signal). Therefore, the input signal of red is equivalent to the input signal of cyan, and a group of values of cyan at that time such that achromatic color is formed are linear are signal output values of the LUT for cyan. Based on these relationships, the LUT of cyan can easily be determined.

On the other hand, in the BK gradation correction method, BK is set to have lightness linearity. That is, 64 gradations (not matrix) of a single color are output, and chromaticity information (L*, a*, b*) is calculated at the reader. Only the L* (lightness) of the chromaticity information is extracted, and the LUT is generated so that the lightness changes linearly. Regarding gradation correction for BK, since gradation correction by a single color is closed (i.e., not affected by another gradation correction for cyan, magenta, and yellow) in the manner described above, the correction sequence thereof may be first or last.

The important thing in this embodiment is that, as described above, importance is placed on the gradation characteristics of red in order to determine Y and M, and thereafter, gradation characteristics of C are determined so that three-color BK (a patch image of an equal amount of different colors) becomes an achromatic color.

An image from the next print job is formed via the LUT of each color determined in the above-described manner.

By causing the image forming apparatus to have gradation characteristics calculated by such a method, it is possible to provide an image forming apparatus in which the change of color due to hue variations when an image signal indicating green is output is reduced, and gradation of red, which is often used in DTP, and smoothness of the flesh color, which is influenced by red, can easily be reproduced.

Subjective evaluation results in which the above are verified are summarized below.

Figure 6:
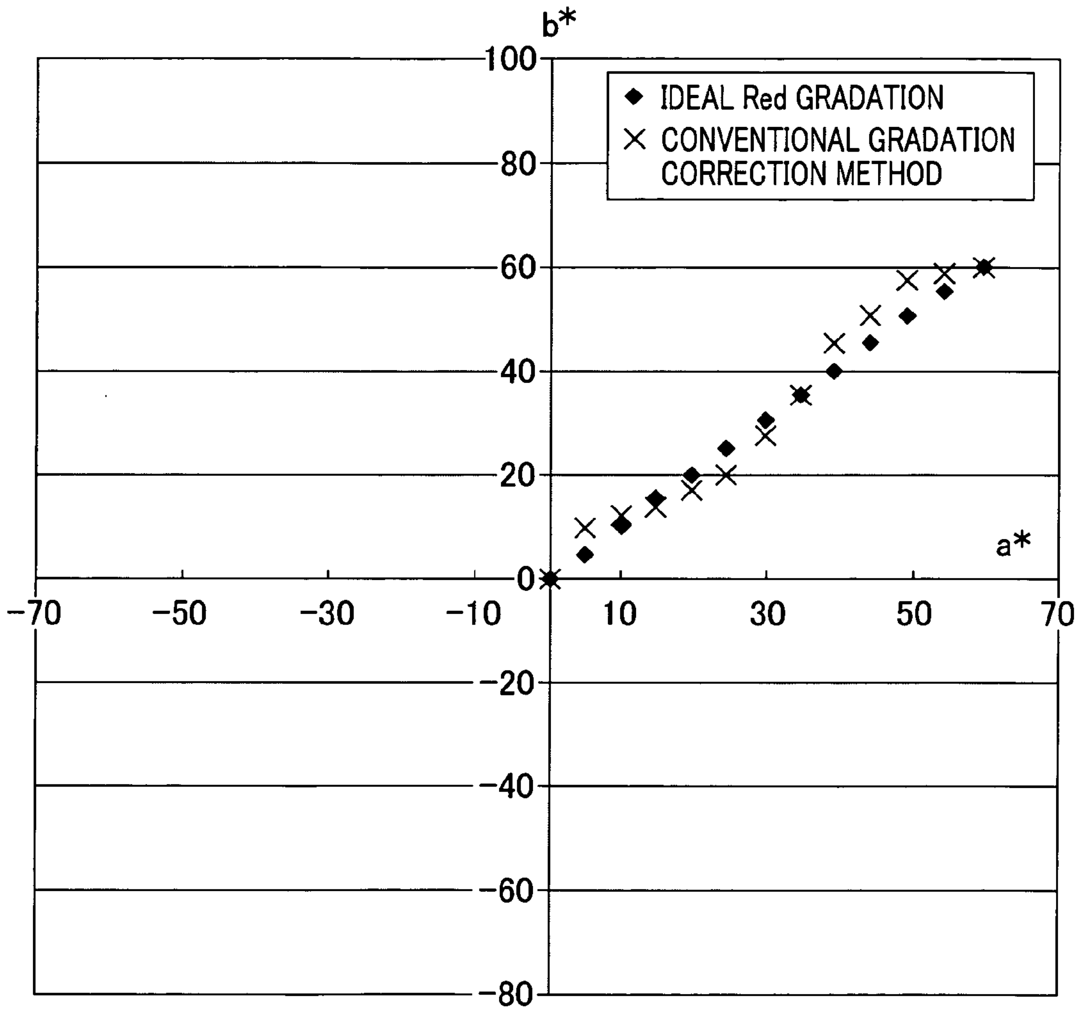
FIG. 6 conceptually shows differences between ideal characteristics of red gradation in the embodiment of the present invention and a secondary color equal-amount signal in the conventional case.

The table (to be shown below) shows a comparison between an image which is output with gradation characteristics such that importance is placed on chromaticity gradation characteristics of red, described in this embodiment, and an image on which gradation correction for only the conventional chromaticity gradation characteristics of a single color is performed. These chromaticity gradation characteristics are shown in FIG. 6. Hue variations of a secondary color occurs during chromaticity gradation correction of only the single color.

The red gradation evaluation and smoothness evaluation of the flesh-color portion show the average of the subjective evaluation of 20 examinees, and also shows the results when 175-line output articles of offset printing was set at 10. Red gradation was evaluated by a chart in which, for the input signal, the equal-amount signal of YM was changed continuously from 0 to 100%.

On the other hand, the gradation of the flesh-color part is output by creating an ICC profile of each of gradation characteristics (gradation characteristics on which importance is placed on chromaticity gradation characteristics of red and gradation characteristics of only the conventional chromaticity gradation correction for a single color) and by assuming a printing target (here, printing reference target certified by JapanColor: ISO/TC130). The evaluation of the flesh-color part was performed using an image, which is a person image, having some area in the entirety thereof.

The color matching accuracy of color parts was evaluated by picking up 10 kinds of flesh-color patches contained in the flesh-color part. In this method, the difference of the average color between the chromaticity values of the printing target and the output article which was actually output via the color management system (each ICC profile created in the above) is shown.

It can be seen from these results that gradation characteristics in which importance is placed on red gradation are superior.

(Red Gradation Evaluation and Smoothness Evaluation of the Flesh-Color Part)

TABLE 1

| | Red gradation | Smoothness of flesh-color part | FLESH-color CM accuracy |
|---|---|---|---|
| Red evaluation on which importance is placed | 8 | 8 | ΔE = 2.7 |
| Only gradation characteristics of single color | 5 | 6 | ΔE = 3.6 |

* The greater the value of the red gradation and the smoothness of the flesh-color part, the higher the evaluation, and the smaller the ΔE, the higher flesh-color CM accuracy is.

(Image Processing Section of the First Embodiment)

Figure 7:
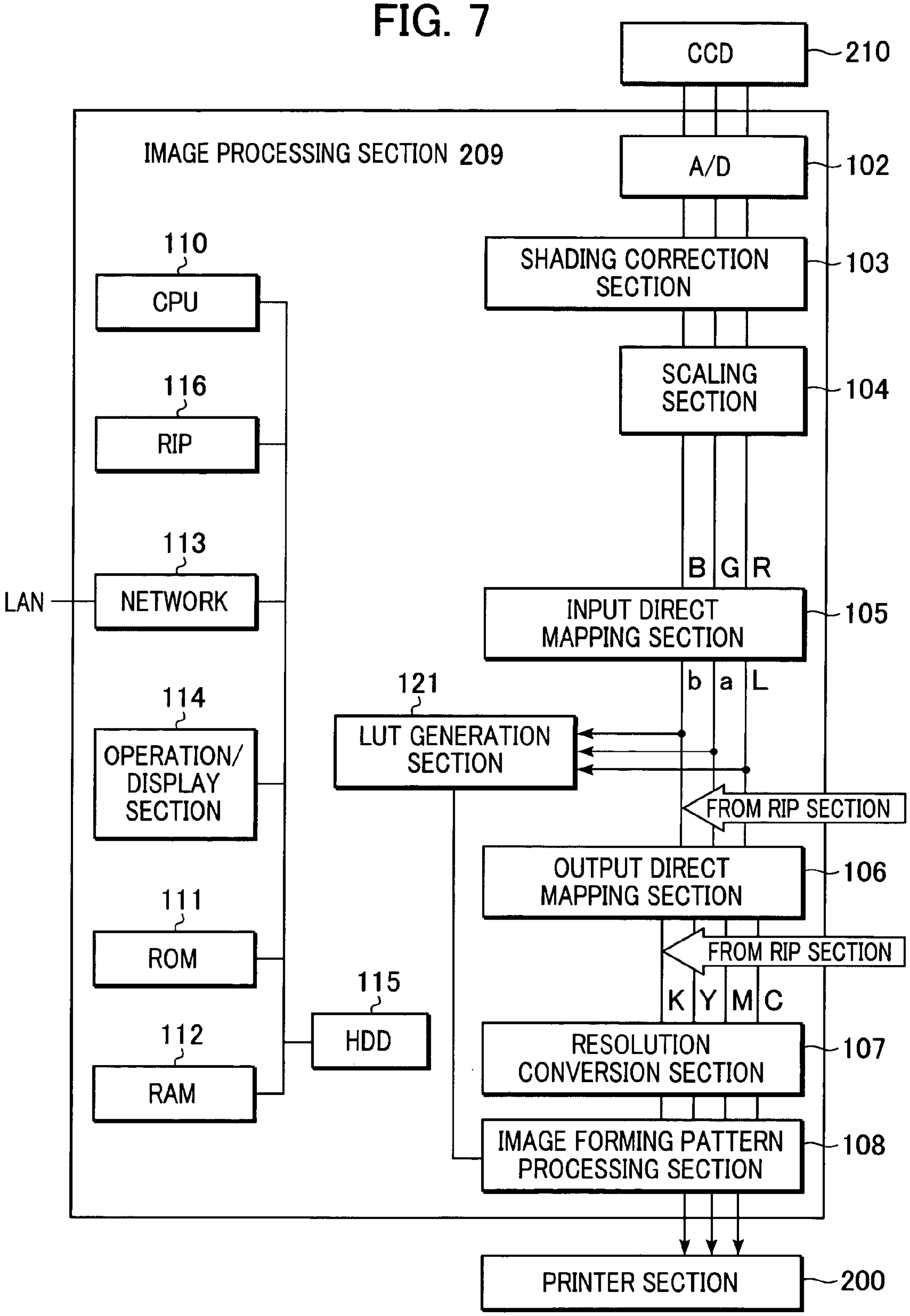
FIG. 7 schematically shows the configuration of an image processing apparatus according to the first embodiment of the present invention.

The configuration of the image processing section will now be described below. FIG. 7 is a block diagram showing an example of the schematic configuration of an image processing section 209.

In FIG. 7, a CCD 210 reads a manuscript image at 600 dpi, and inputs the read image as an RGB signal to the image processing section 209. The RGB signal input to the image processing section 209 is converted into a digital RGB signal by an A/D converter 102.

A shading correction section 103 corrects the amount of illumination light, variations of the amount of light, which occur in the lens optical system, and variations of the sensitivity of the pixels of the CCD 210. A scaling section 104 expands or reduces the read image. An input direct mapping section 105 converts the input RGB signal into a L*a*b* signal, which is a color space independent of a device. An output direct mapping section 106 converts a L*a*b* signal into a specified CMYK signal. A resolution conversion section 107 converts an image signal of 600 dpi into 1200 dpi, and on/off control of the resolution conversion is possible under the control of the CPU 110.

An image forming pattern processing section 108 has a multi-value function by a line growing type dither and dot concentrated type dither method, and an image forming pattern is selected under the control of the CPU 110. Each signal of CMYK, which is output from the image forming pattern processing section 108, is sent to a printer section 200. In the image forming pattern processing section 108, processing using an LUT for correcting gamma characteristics of the printer section 200 is also performed. It is common practice that LUT processing is basically performed before pattern processing such as matrix computation. The LUT contained in the image forming pattern processing section 108 is configured in such a manner as to be rewritten in accordance with an instruction from the CPU.

The image signal which has passed through the input direct mapping section 105 is sent to an LUT creation section 121 as necessary. The LUT creation section 121 operates to control the generation of signals of each of the above-mentioned matrix patches, generate a gradation correction table (LUT) of each color in accordance with the flow (to be described later) by using the input L*a*b* information, that is, information obtained by reading the above-mentioned matrix patches, and upload the gradation correction table to the image forming pattern processing section 108.

More specifically, the LUT creation section 121 has functions for converting the input L*a*b* information into hue and chroma information and for creating an LUT of each color by using the above information together with signal information on each of the above-mentioned matrix patches, which is determined in advance.

Figures 11A, 11B:
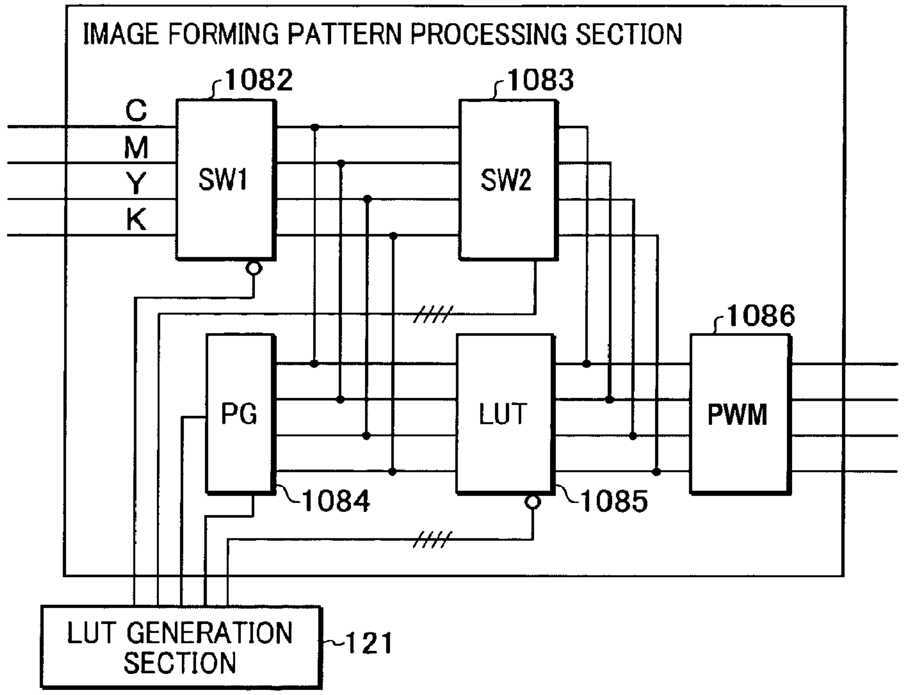
FIGS. 11A and 11B show the configuration of a portion, related to the present invention, of an image forming pattern processing section shown in FIG. 7.

The structure for the above-described processes, of the image forming pattern processing section 108 shown in FIG. 7 is shown in FIGS. 11A and 11B. In FIGS. 11A and 11B, reference numeral 1084 denotes a pulse generator (PG) for outputting an image signal of each matrix patch. Reference numeral 1085 denotes an LUT. Reference numerals 1082 and 1083 each denote a SW circuit for switching a signal path, which is capable of turning on/off the output upon reception of control input. Here, an SW2 and the LUT are capable of individually turning on/off the output with regard to OMYK. In the pulse generator PG, for example, when red gradation is to be output, the output of C and K is zero, and the output of the other C, M, and Y when the gradation of the single color BK is to be output is zero. As shown in the figure, the outputs of the SW1, the SW2, the PG, and the LUT are turned on/off upon reception of the control from the LUT creation section 121, and in each operation state, the signal path shown in FIG. 11B is formed.

In FIGS. 11A and 11B, the signal path for uploading the set values to the LUT is omitted for the sake of simplicity.

In FIG. 7, the CPU 110 centrally controls each section of an image processing section 209 by using a RAM 112 as a work memory in accordance with a control program stored in a ROM 111, and also performs control for setting parameters in, for example, the resolution conversion section 107 and the image forming pattern processing section 108. The CPU 110 controls a network I/F 113 for performing communication with an operation display section 114 and an external device, and performs input/output with the outside with regard to image information and device information. That is, the CPU 110 is a processor for controlling the entire system.

An HDD 115 is a hard disk drive for storing system software, general image data, and outputted image data (user settable). Furthermore, the HDD 115 functions to transmit information input by a user of this system from the operation section 114 to the CPU 110. A raster image processor (RIP) 116 develops PDL code into a bit-map image, and sends a L*a*b* or CMYK signal to the input line or output line of the output direct mapping section.

(Flowchart in the First Embodiment)

Figure 8:
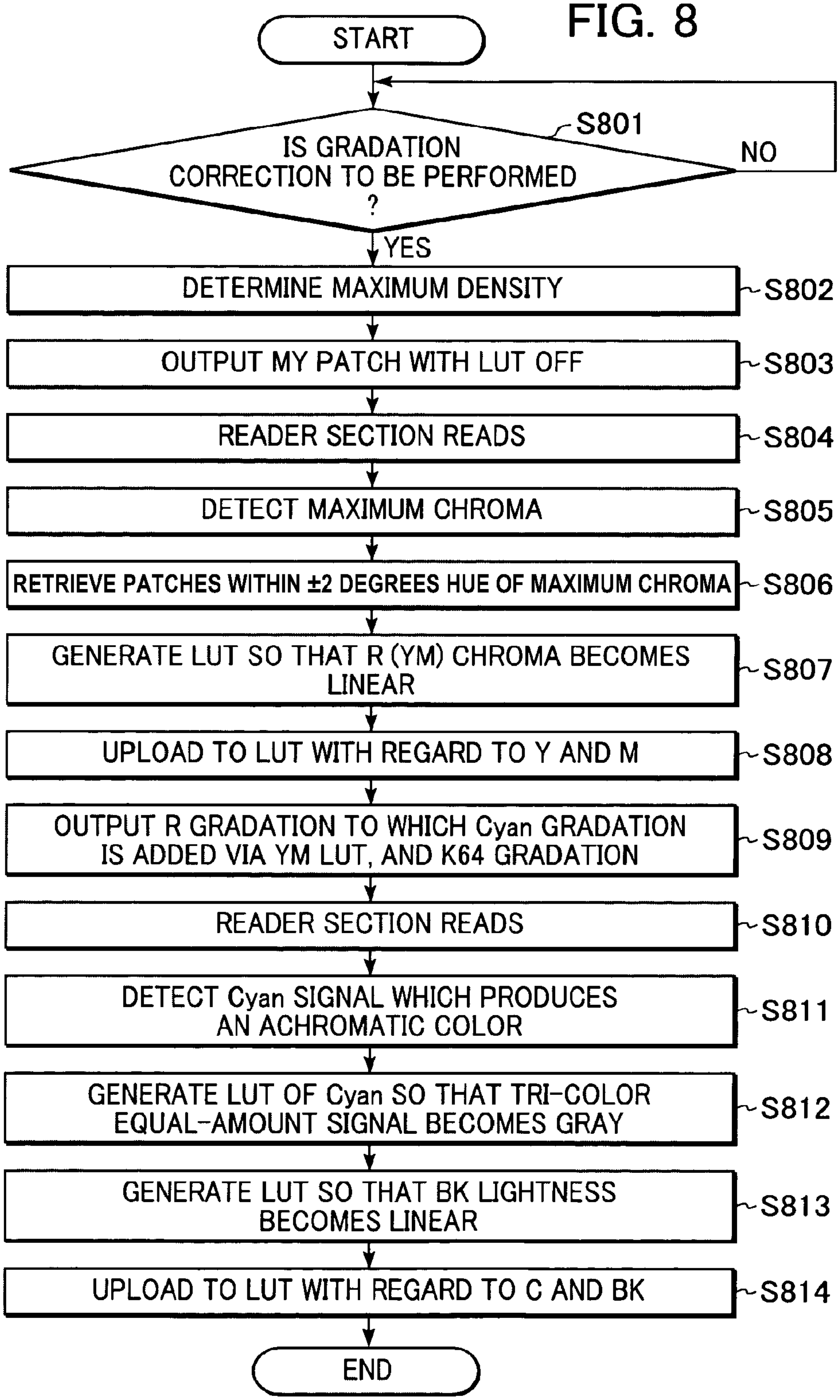
FIG. 8 is a flowchart showing control according to the first embodiment of the present invention.

The flowchart of control according to this embodiment is shown in FIG. 8.

The image forming apparatus for which automatic gradation correction has been instructed, and/or for which gradation correction is to be performed (S801), determines the contrast potential using a surface electrical-potential sensor and a photo-sensor for detecting a toner patch image on the drum by a method described in the second embodiment of Japanese Unexamined Patent Application Publication No. 10-28229 described in the related art, and determines (ensures) the maximum density. That is, by using data indicating the maximum density of each color, a patch is formed under predetermined conditions. The contrast potential is calculated at which the output patch which is formed by data indicating the maximum density of each color indicates a predetermined density on the basis of the measured results of the contrast potential when the patch is formed and the density of the formed patch. Then, it is set at the calculated contrast potential (S802). The subsequent image formation is performed by using this set contrast potential.

Thereafter, by using the output of the pulse generator 1084, thinned-out 2047 patches of a 64-gradation matrix in which M and Y are equal to each other in a state in which the LUT is off is subjected to latent image formation, development, transfer, and fixing, and the patch image is output onto the medium output (S803).

The output 64-gradation matrix patch is placed in the reader section by the user, and an image is read in accordance with an instruction on the display section (not shown) (S804).

The 64-gradation matrix patch which is read from the reader section is converted from the luminance signal of RGB into chromaticity information (L*a*b*). The LUT creation section 121 converts the chromaticity information (L*a*b*) into chroma and hue information. Based on the converted information, the hue information is obtained by taking note of the hue of the red patch having the maximum chroma (S805). Next, a group of patches of the combination of yellow and magenta, which is within ±2° of the hue of the red patch having the maximum chroma is extracted (a group of patches in which the hue of red is nearly fixed and the chroma changes linearly are extracted) (S806).

Here, for the extraction of the combined patches, for example, a patch is extracted having a hue value within ±2 of the hue of the red patch at which the maximum chroma is produced. The extraction may be accomplished, for example, on the basis of the determination of a position of the matrix composed of each gradation of yellow and magenta, shown in FIGS. 2A and 2B, that corresponds to the patch. When an image signal of red, which changes linearly, is input from the group of patches of the extracted combination of yellow and magenta, an LUT for gradation correction of yellow and magenta, for outputting yellow and magenta so that the change of chroma becomes linear is created (S807). This created LUT is uploaded to the image forming pattern processing section 108 (S808) so as to be in preparation for output for the next time and later. The above configuration made it possible to realize calibration of the secondary color, in which the reproduction of the secondary color (red) is such that chroma becomes linear.

The output of the pulse generator 1084 is subjected to gradation correction via the LUT for yellow and magenta, which is created in the above-mentioned manner, in order to obtain the image signal of yellow and magenta. A matrix patch of red 64 gradations, formed based on this signal, and LUT-off 64 gradations of cyan, which is not yet calculated, and LUT-off of 64 patches of BK are output (FIGS. 5A and 5B) (S809).

This output patch is placed in the reader section again by the user, and an image is read in accordance with an instruction on the display section (not shown) (S810).

The 64-gradation matrix patch of C and red, which is read from the reader section, is converted from the luminance signal of RGB into chromaticity information (L*a*b*). The LUT creation section 121 converts the chromaticity information (L*a*b*) into chroma and hue information. Based on the converted information of the 64-gradation matrix patch of C and red, a patch of an achromatic color is extracted (S811). Based on the signal value at which the extracted achromatic-color patch was formed and the density value of the achromatic color, a determination is made as to which degree of cyan should be mixed to the red gradation in order to produce an achromatic color, and a group of signal values for cyan, which are closest to the achromatic color, are used. That is, gradation characteristics (LUT) for cyan is determined so that the three-color equal-amount signal (CMY equal-amount input signal) patch becomes an achromatic color (so that a group of signals of cyan, which was used earlier with respect to the input of the three-color equal-amount signal, are output) (S812). With this configuration, with respect to yellow and magenta, which is subjected to gradation correction via the created LUT, the gradation-correction characteristics of cyan are determined so that the reproduction of the achromatic color is realized. As a result, the linearity of the chroma reproduction of red is realized, and moreover, high reproducibility of the achromatic color (gray) can be realized. As a result, calibration of the secondary color is realized, and further, gray calibration that realizes high reproduction of gray can be realized.

On the other hand, regarding BK, an LUT is created so that the change of the lightness becomes linear with respect to the change of the input image signal (S813). That is, the LUT may be created in any sequence regardless of another color (not necessary to be last).

The LUTs for cyan and BK, which are determined in this manner, are uploaded to the image forming pattern processing section 108 so as to be in preparation for output at the next time and later (S814).

During the normal image formation, by performing gradation correction using the LUTs for cyan, magenta, yellow, and black, which are formed in this manner, the linearity of chroma for red, which is a secondary color, can be compensated for, and also, reproducibility of gray can be compensated for. Furthermore, regarding BK, it is possible to cause the change of lightness to become linear.

As has thus been described, the image forming apparatus of this embodiment is able to reduce hue variations of a secondary color, which occur in the calibration operation of only the single color, and variations of gray balance, and is able to improve color matching accuracy and the smoothness of gradation.

Second Embodiment

Quick CAL (Simplified Version of the First Embodiment)

The features of the second embodiment are such that the ease of operation for a user is substantially improved more than that of the gradation correction method which is used in the first embodiment. A function of being capable of performing calibration for only the single color is added to the function of the first embodiment.

The calibration function needs to be simplified from the viewpoint of user's operation efficiency. In the first embodiment, since two outputs composed of a matrix patch exceeding 1000 patches must be performed, there are matters to be considered of the user's operation burden, the amount of toner consumption, and a longer calculation time (slow processing speed). Of course, in order to take priority on accuracy, the configuration of the first embodiment is desired, but there are cases in which importance is placed on greater efficiency depending on the use objective of the user.

Therefore, in this embodiment, high-accuracy calibration (hereinafter referred to as "full calibration"), which is performed in the first embodiment, and a quick calibration function, which is performed in a case where, although longer-term variations are small, there are shorter-term variations after an elapse of a certain period after the high-accuracy calibration is performed, are provided.

For the full calibration in this embodiment, calibration in which a secondary color (red) and gray balance are taken into consideration is performed in accordance with a flow similar to that of the first embodiment. At this time, in preparation for quick calibration at a later time, input/output characteristics for the gradation of each single color, that is, single-color LUT target information, is stored. This is a value such that the gradation patch of the single color is output, and the measured value of the gradation patch is corrected using the measured value in the full calibration.

On the other hand, the features of the quick calibration are such that single-color gradation characteristics are changed so that the measured density of the output patch matches the single-color LUT target information, which is stored during full calibration. In this embodiment, with respect to the signal of a predetermined level, the target information is defined as information which specifies the density of the image to be formed in accordance with the signal of the predetermined level. Of course, information capable of generating such target information can be used similarly to the target information.

(Gradation Correction Method of the Second Embodiment)

The structure of full calibration is substantially the same as that of the first embodiment, and accordingly, a description is given with emphasis on processes which are newly added to full calibration of the first embodiment for the sake of simplicity.

First, the image forming apparatus for which full calibration is performed outputs a matrix patch of 64 gradations of yellow and magenta with LUT off. At this time, in the first embodiment, 2047 patches (FIGS. 2A and 2B) of the thinned-out matrix patch, in which the red hue is considered to be fixed, is used; the features of this embodiment are that 64 patches (not shown) of 64 gradations of a single color (yellow and magenta) are contained in addition to the matrix patch.

It is clear that the patches in the intermediate to high density portions of the single color do not have gradation of red, and are not used for the full calibration. Since data for targets for quick calibration, which is performed after full calibration is performed, is generated at the same time, and this data is output and colorimetered.

A description is given in more detail. During full calibration, the combination of yellow and magenta is determined so that the red hue is fixed, and thereafter, the gradation characteristics of a single color (yellow and magenta) are determined so that the image signal and the chroma of red becomes linear. The features of the finally calculated gradation characteristics are based on the measured value of the patch of red which is a secondary color. The measured values (target values) of patches of single colors of yellow and magenta, which form the red patch, are stored; during the subsequent quick calibration, matching with the stored target value of the single color is made, with the result that a process for matching gradation characteristics similar to those during full calibration is performed. This processing is based on the assumption that the relationship between the output gradation characteristics of a single color of Yellow and magenta and the gradation characteristics of the secondary color (red) composed of yellow and magenta is fixed or nearly fixed.

Similarly, the patch of the single-color gradation of cyan is also output when the matrix patch of red is output and is colorimetered. The same applies to the single color of BK as in the first embodiment.

A description will now be given of a method of storing the actual single-color gradation characteristics during full calibration in this second embodiment, that is, the target information.

The gradation characteristics (target information) of yellow and magenta, which are finally determined during full calibration, are stored as single-color information in the form of a RGB signal which is output from the CCD 210 of the manuscript reading section 7. During the actual full calibration, a conversion is performed from RGB to L*a*b* to hue and chroma information. Calculations can be performed with high accuracy as a result of the above, but matters to be considered about the problems of the processing speed and the storage capacity (memory) due to the fact that storage information is multi-dimensional, remain. Therefore, in this embodiment, target information is provided in the form of the luminance information of RGB, which is determined at first.

The image forming apparatus for which the gradation characteristics of red, that is, the gradation characteristics of yellow and magenta are determined by full calibration analyzes the RGB information of the patch in order to calculate the gradation, which is the target of the density of the image formed on the basis of each signal level.

The luminance data of blue is stored as the target of yellow, which is a primary color of the print color. In the case of magenta, the target is stored using the luminance data of green. In the case of cyan, the target is stored using red information. That is, a relationship of a complementary color is formed.

The image forming apparatus for which the gradation characteristics of red are determined analyzes the measured data (RGB data) of the gradation patch of the single color of yellow and magenta, and stores the target for the output luminance information, the target varying relative to the input signal. Furthermore, the image forming apparatus analyzes the measured data (RGB data) of the gradation patch of the single color of cyan when the gradation characteristics of cyan are determined to ensure gray balance, and stores the target. As described above, in the full calibration of this embodiment, in addition to the full calibration in the first embodiment, targets of the gradation patches of three colors of cyan, yellow, and magenta, excluding BK, are stored.

Figure 9:
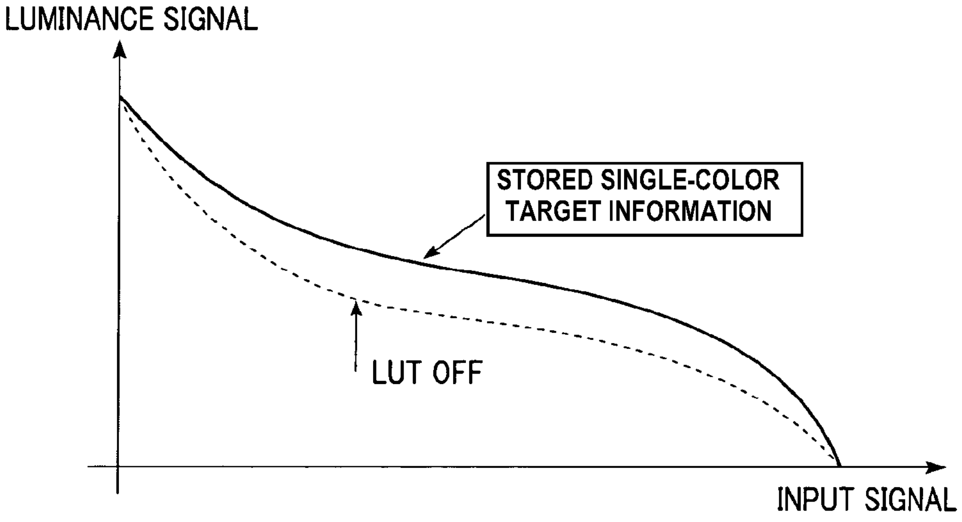
FIG. 9 illustrates an example of a quick CAL target and gradation characteristics when the LUT is off, according to a second embodiment of the present invention.

During quick calibration which is performed at a predetermined timing after the above-described full calibration is performed, the patch image of 64-gradation LUT off of single colors of three colors of cyan, yellow, and magenta, excluding BK, is output, and the RGB luminance information is obtained at the reader. Then, the RGB luminance target information stored during the full calibration is read, a gradation correction coefficient is calculated such that the output luminance target information becomes equivalent to the RGB luminance target information with respect to the input signal, and the contents of the LUT are changed by using the calculated correction coefficient. The conceptual view of the stored single-color target information and gradation characteristics during LUT off is shown in FIG. 9.

As a result of such configuration being formed, gradation characteristics such that hue variations and gray balance variations are small, which are nearly equivalent to those of full calibration, can be realized simply, and further, the burden of the user can be minimized in the quick calibration.

(Image Forming Apparatus of the Second Embodiment)

As described in the above overview, the features of the second embodiment are that the flow of the quick calibration is simplified more than the flow of the first embodiment, and the burden of the user is minimized.

The image processing apparatus will now be described below with emphasis on the added functions.

Figure 10:
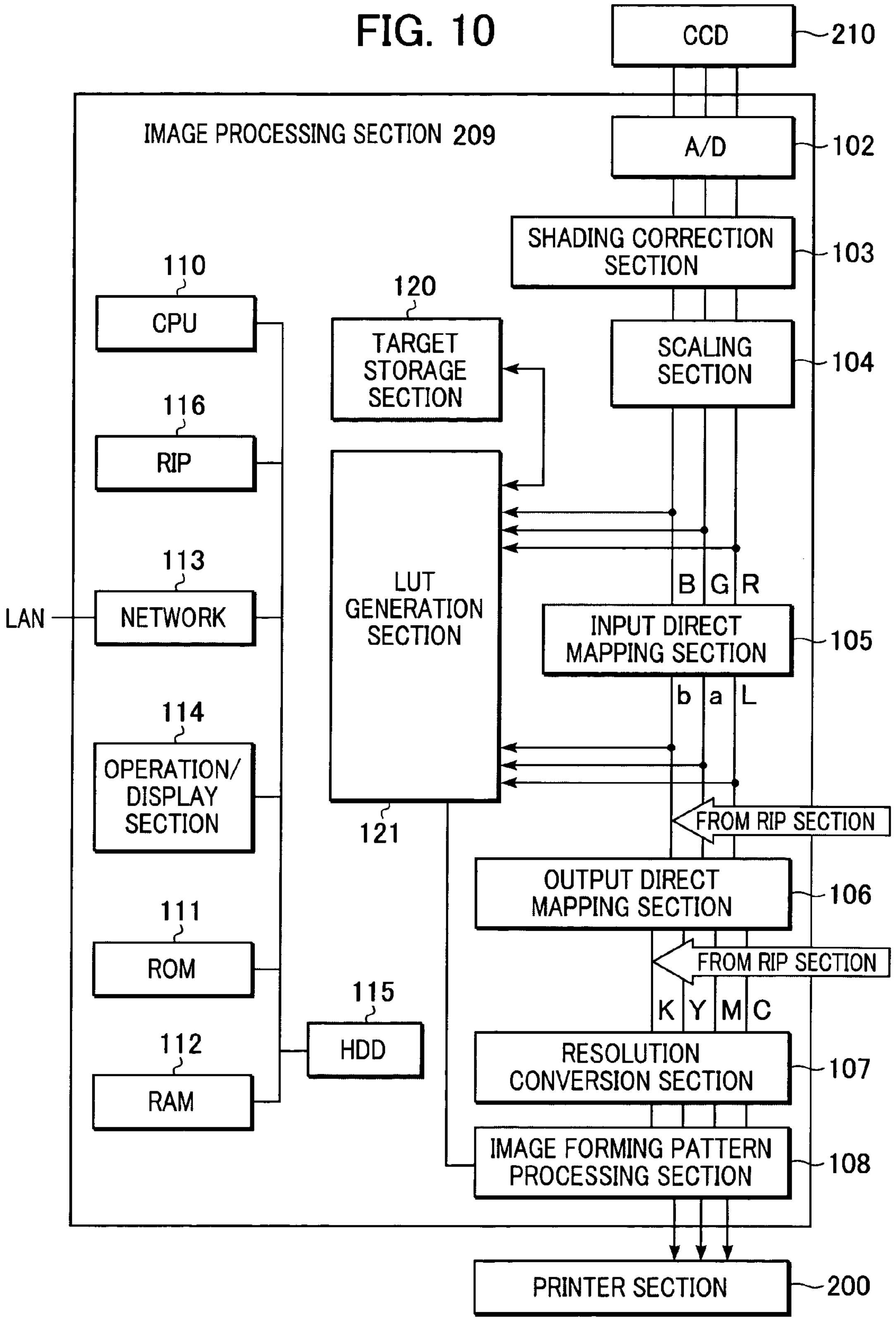
FIG. 10 schematically shows the configuration of an image processing apparatus according to the second embodiment of the present invention.

FIG. 10 shows the schematic block diagram of the image forming apparatus used in the image processing apparatus of this embodiment. Components having the same function as that of the components shown in the first embodiment are designated with the same reference numerals.

The features are such that, to form target information as an RGB signal, information is supplied to the LUT creation section 121 before the RGB to L*a*b* conversion section. Furthermore, the luminance information of the single-color gradation characteristics, which are calculated or stored during full calibration, is stored. A target storage section 120 is newly provided. The remaining construction is nearly the same.

(Flowchart in the Second Embodiment)

Figure 12:
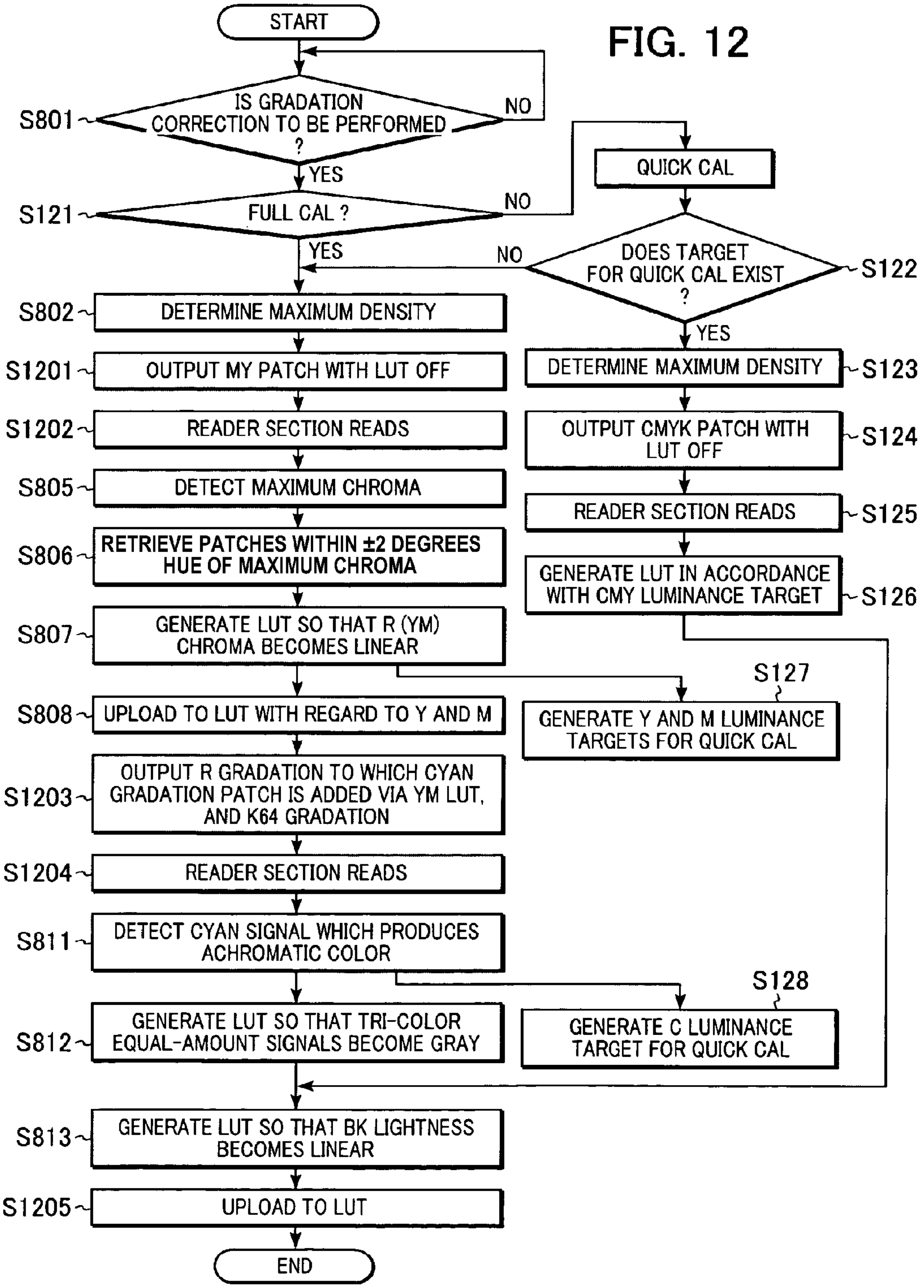
FIG. 12 is a flowchart showing control according to the second embodiment of the present invention.

The flowchart in this embodiment is shown in FIG. 12. Here, the same steps as those of FIG. 8 showing the flow of the first embodiment are indicated at the same step numbers, and steps S121 to S128 are added steps. Steps S1201 to S1204 are added steps when compared to the first embodiment.

In the image forming apparatus for which full calibration is selected by the user, the process proceeds in the flow which is the same as that of the first embodiment. In step S1201, in addition to the process of step S803 in FIG. 8, 64-gradation patches of the single color of M and Y are output. Thereafter, in step S1202, in addition to the process of step S804 in FIG. 8, patches of the single color of M and Y are read. Following the process of step S807, in step S127, luminance target information of Y and M is generated and stored in preparation for quick calibration. In a similar manner, in step S1203, in addition to the process of step S809, a 64-gradation patch of the single color of cyan is output, and in step S1204, in addition to the process of step S809, an image of the single-color patch of cyan is read. Furthermore, following the process of step S811, in step S128, luminance target information of cyan is generated and stored in preparation for quick calibration. The storage of the target information in steps S127 and S128, unlike the process of generating LUTs for Y and M, is performed on the basis of the input data in the form of RGB of the input direct mapping section, that is, the values of RGB of the measured value of each single-color patch. In other words, in the manner described above, the predetermined luminance data of blue to be obtained is stored as the target of yellow with respect to the patch of the predetermined signal level of Yellow. In the case of magenta, the luminance data of green is stored, and in the case of cyan, the luminance data of red is stored.

When it is instructed in step S121 so as to perform quick calibration, processes of step S122 to S126 are performed. When the presence or absence of the target information is checked and it is determined that the target information does not exist in step S122, the process proceeds to step S802, where full calibration is performed. When otherwise, the process proceeds to step 123, where the process similar to step S802 is performed. Thereafter, in a state in which the LUT is off, latent-image formation, development, transfer, and fixing of the image signal of the single-color patch of C, M, Y, and K of 64 gradations are performed, and the image is output onto the recording medium (S124). The recording medium on which the output image of a 64-gradation matrix patch is recorded is placed in the reader section by the user, and the image is read in accordance with an instruction on the display section (not shown) (S125). In this reading, the input data in the form of RGB of the input direct mapping section is used, and the measured results of the 64-gradation matrix patch of each color are obtained. Based on these measured results, the values stored in the target storage section 120, stored in the form of the RGB luminance signal in the manner described above, and each signal level of the 64-gradation matrix patch, LUTs of C, M, and Y for each color are created, and similarly, the LUT of Bk is also created (S126). Each of the created gradation correction coefficients, that is, the data for the LUTS, is uploaded to the LUT 1085 (S1205) within the image forming pattern processing section 108 in preparation for the subsequent image formation via a path (not shown).

For Bk, the LUT may be changed so that L* becomes linear with respect to the input signal by using the information of L* similarly to the first embodiment.

As has thus been described, the image forming apparatus of this embodiment is capable of substantially simplifying the full calibration function and improving usability.

Third Embodiment

Secondary Color on which Importance is Placed can be Selected as Desired

The third embodiment is configured in such a manner that importance is not placed on the red gradation characteristics, and instead, the user is able to select the secondary color on which importance is placed, as desired. This differs from that described in the first and second embodiments.

As a background for making possible such desired selection, importance is placed on the red gradation due to the way Japanese people sense flesh color and the narrowness of the visual-angle differential limen. However, there are various kinds of people in the world, and it is well known that the visual-angle differential limen differs from color to color.

In addition, which color of gradation characteristics importance is placed on an output article variously depends on the user and the output article. Therefore, it is preferable in the image output device that the user be able to select the color on which importance is placed, and this embodiment is formed in such a configuration.

(Image Forming Apparatus of the Third Embodiment)

In this embodiment, a description is given using the image forming apparatus and the image processing apparatus of the second embodiment. There is no large change in the configuration of the image processing apparatus, and the role of each section is slightly changed.

(Flowchart in the Third Embodiment)

Figure 13:
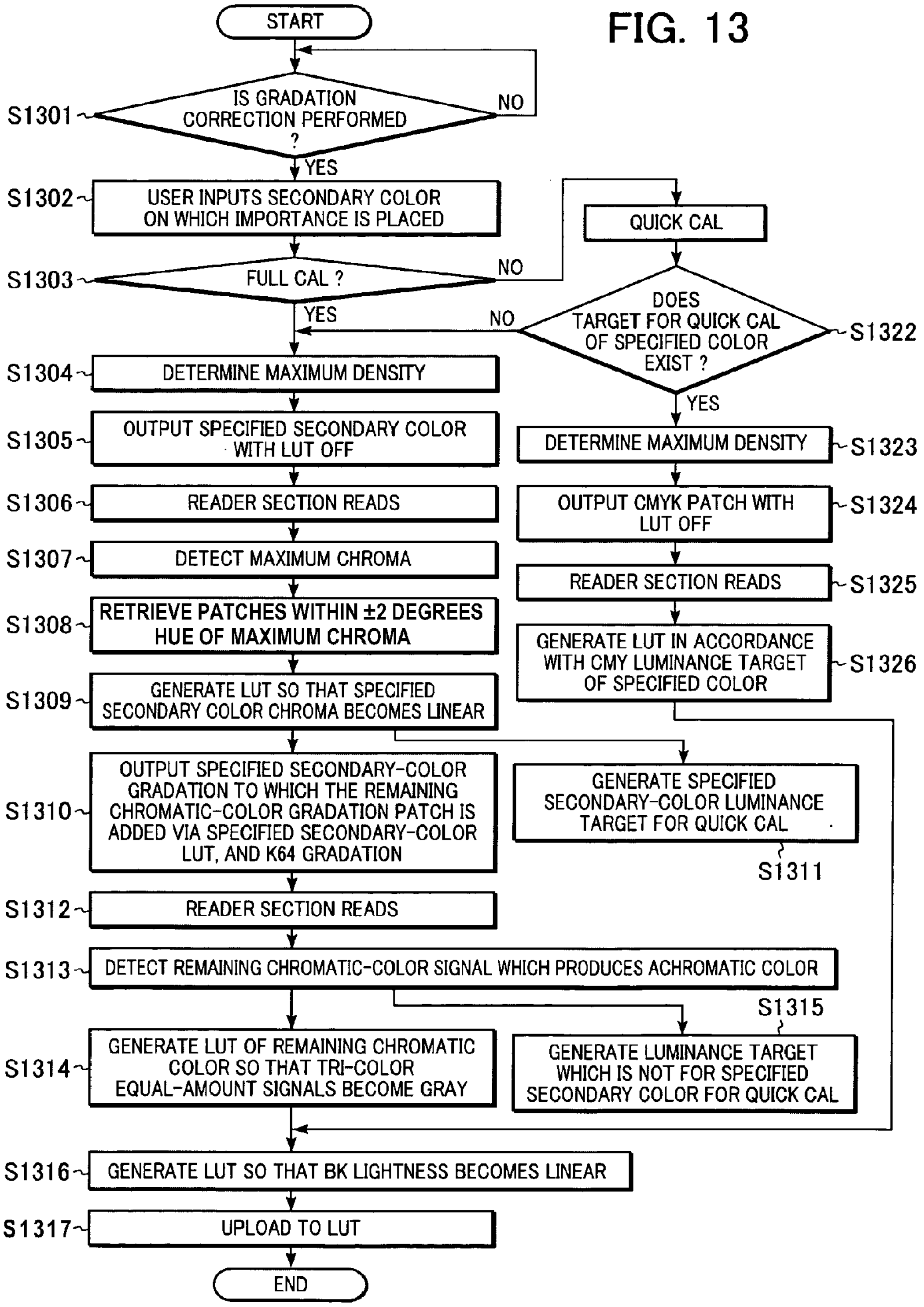
FIG. 13 is a flowchart showing control according to a third embodiment of the present invention.
Figure 15:
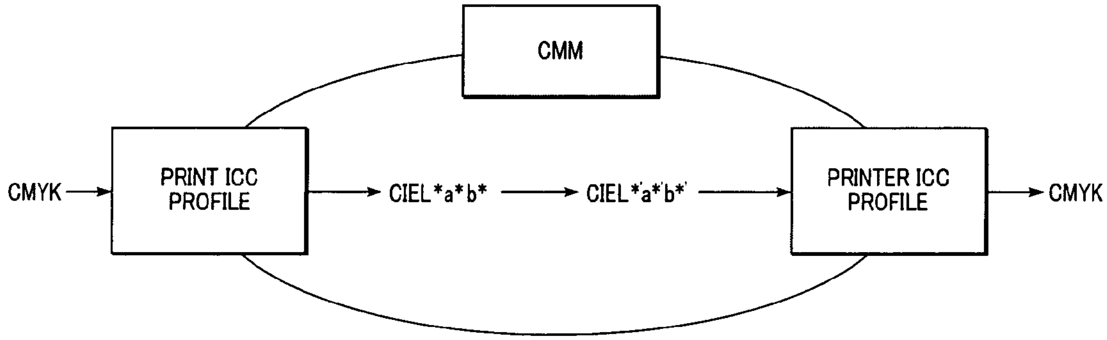
FIG. 15 shows the flow of color management according to a conventional example.

The flowchart in this embodiment is shown in FIG. 13. Processes which are substantially the same as those in the flowchart of the second embodiment described with reference to FIG. 12 are omitted, and differences will be described.

The image forming apparatus for which full calibration is selected by the user causes the user to make a selection as to which color importance should be placed on (S1302).

The secondary-color matrix patch and 64 gradations of the single color for quick calibration are output with regard to the color corresponding to the selected secondary color (S1305). A description will be given in more detail. When red is selected, matrix patches of yellow and magenta are output; when green is selected, matrix patches of yellow and cyan are output; and when blue is selected, matrix patches of magenta and cyan are output.

As single-color target for quick calibration, three types of a target for assuming red to be importance, a target for assuming green to be importance, and a target for assuming blue to be importance can be stored, and a selection as to which color of a secondary color importance should be placed on can be made also during quick calibration. Therefore, in step S1322, for example, in spite of the fact that green has been selected in the previous step S1302, when a target for which green is a specified color does not exist, the process proceeds to step S1304, where full calibration is performed.

Since the subsequent flow does not require a particular description because the color matching of red in the second embodiment is changed to a desired red, green, and blue, a further description is omitted.

With the above configuration, color matching of gradations on which user places importance is possible, and thus, a high image-quality image forming apparatus with high usability can be provided. Although the third embodiment has been described using the method in the second embodiment, the third embodiment could also have been described using the method in the first embodiment substituting any desired equal-amount secondary color in place of red.

Fourth Embodiment

In the fourth embodiment, usability and operation efficiency are further improved when compared to the configuration of the third embodiment.

In the first to third embodiments, during both full calibration and quick calibration, an output article is moved to the reader by the user, and colorimetering operation is performed.

This embodiment aims to reduce the burden of the user, such as those described above. A description is given in more detail. The features of this embodiment are such that, during quick calibration, an output onto a recording medium (mainly paper) is not performed, and the remaining level of toner is calculated using a patch detection sensor on the photosensitive drum, so that the LUT is corrected.

There are no changes related to the configuration of the main unit of the image forming apparatus.

(Gradation Correction Method of the Fourth Embodiment)

A gradation correction method of this embodiment will now be described below.

This embodiment differs from the third embodiment in a method of determining a quick calibration target. For this reason, 64-gradation patches of a single color, which are output for quick calibration, are deleted, and a matrix patch of a secondary color, which is used in the first embodiment, is used.

An important secondary color is selected, and the image forming apparatus for which full calibration is instructed outputs a matrix patch in the corresponding color, performs colorimetering, and determines the LUTs of two colors. The secondary color, the remaining colors, and 64 gradations of K are output via the LUT, the LUTs for all the colors are created, and these are sent to the image forming pattern processing section in preparation for the next image formation.

64 patches via the LUT for each color, determined in this manner, are formed on the photosensitive drum. This patch image is detected by a photo-sensor used for detecting the maximum density in the first to third embodiments, the amount of reflected light is A/D converted, forming an amount-of-reflected-light target table. As has also been described in the third embodiment, for quick calibration targets, targets for assuming each of the secondary colors red, green, and blue to be of importance can be stored.

Hereafter, when quick calibration is instructed, a toner image with the LUT off is formed on the drum, and the LUT is changed so that it becomes the above-described stored target. Since the flow thereof is substantially the same as that of the third embodiment, descriptions thereof are omitted. As a result of adopting such configuration, it is possible to provide an image forming apparatus having ease of operation, in which the burden of the user during quick calibration is reduced.

Fifth Embodiment

In the fifth embodiment, a configuration in which the number of patches during full calibration is decreased is described.

The patch output conditions during full calibration are that the output is performed in a state not via the LUT. In the case of not being via the LUT, since the state in which the printer engine is in cannot be known, the 2047 thinned-out matrix patches, described in the first embodiment, are output, and LUTs for two colors are created. By forming the above-mentioned configuration, a gradation correction method capable of dealing with various variations can be realized. However, there are cases in which the processing speed becomes slow, and the amount of toner consumption is great, which are undesirable for the user.

For this reason, the features of this embodiment are that, by using a matrix patch in which the gradation correction LUT of the previous time was used, the number of patches is small, and the demand of the user is met.

In this method, first, a determination is made as to what the signal value 32 gradations of the input red (the amounts of Y and M are equal) have become via the LUT. A total of patches of 32×(1+3+3)=224 patches (MAX is 255) are formed in which, by assuming the patch to be a reference (32 gradations at this point in time), there are three gradations (+2, +4, +6 levels) in the Y-increasing direction and three gradations in the M-increasing direction. Furthermore, since 255 of red cannot be increased further, gradation characteristics of Y and M can be known by a total of 218 patches (224−(3+3)). The conceptual view in this case is shown in FIG. 14.

In the table shown in FIG. 14, in the central horizontal row, linear levels of 64 gradations are shown as a red input signal, and below them, the levels of the Y and M signals forming their respective red gradations are shown. In other words, for example, since red=8 is represented by Y=4 and M=6, it is shown that, with respect to this red gradation, a patch in which only Y is made as 6 (+2), 8 (+4), and 10 (+6) and only M is made as 8 (+2), 10 (+4), and 12 (+6) is created. Such matrix patch can be formed by using a gradation correction coefficient uploaded to the LUT 1085 with respect to the RAM of the pulse generator PG 1084 of, for example, FIGS. 11A and 11B and by passing through the PG 1084-SW2 1083-PWM 1086 signal path.

That is, a reduction of 1382 patches of 2047 patches when the LUT is off and of 218 patches when the LUT is on is possible.

The reason why the increase level is made plus 2 levels are that gradation characteristics are not converted much at one level.

Furthermore, the reason why the base gradation is changed from 64 gradations to 32 gradations is because it is determined that (1) in the case of 32 gradations, an increase in units of 8 levels, (2) when plus 3 gradations (maximum+6 levels) of YM are considered, overlapping portions occur in the case of 64 gradations, and this is inefficient, and (3) equivalent advantages are obtained from the experiment results. Of course, even if gradations are made plus 6 (three gradations for Y, and three gradations for M) while the base is kept at 64 gradations, 442 patches are formed from 64×7−(3+3), and the objective of reducing the number of patches can be achieved.

Furthermore, when variations which cannot be dealt with by patches via the previous LUT have occurred due to the replacement of the fixing roller, the replacement of the drum, or the like, there is the possibility that hue information is not sufficient at the above-mentioned 218 patches, and an accurate LUT cannot be created. In such a case, that is, when calibration is performed, a determination is made as to whether or not the hue information of the measured patch is sufficient for creating an LUT. When it is insufficient, a patch without an LUT is output again, that is, the LUT is created by the method in the above-described first or second embodiment.

As has thus been described, an image forming apparatus can be provided in which the number of output patches can be greatly reduced by outputting the matrix patch via the LUT which was created previous, and usability is improved further.

In a case where a matrix patch for gradation correction is output via the LUT information (gradation correction coefficient) which was created previously, when calculating the gradation correction coefficient calculation after that, when the LUT is not used, to put in a more accurate manner, data conversion is not performed using the LUT, as a signal level used for calculating the gradation correction coefficient, a predetermined level, or information from the part which generates the patch image signal, is used. When the LUT is used, subsequent calculation computations can be made the same by using the data which is converted using the conversion coefficient of the LUT.

Other Embodiments

By making the following changes in the embodiments which have been described, further ease of use and higher image quality can be achieved.

(Additional Quick Calibration Method)

In the second embodiment and those that follow, quick calibration is performed by changing the target to single-color gradation characteristics during full calibration. As a result of such configuration being formed, the target must be formed in a rewritable configuration, and thus, the conventional specified-value target has superior aspects in the memory and the slow processing speed.

Therefore, during quick calibration, calibration may be performed using a conventional specified-value target.

(Timing of Full Calibration)

Full calibration is a superior method capable of achieving accurate matching of a secondary color and gray balance, but is not needed to such a degree as to be performed every morning. The hue of the secondary color varies greatly at the time of replacement of each part, endurable deterioration, and environment variations after left standing for a long time. At such a timing, a message for performing full calibration may be displayed on the display section so as to promote the performance of full calibration. In cases other than such a timing, a display that quick calibration is sufficient may be made.

(Toner Image Sensing Target of the Quick Calibration)

In this embodiment, since a description has been given using a configuration without an intermediate transfer member, the description has been given on the assumption that the detection position of the toner image during quick calibration in the fourth embodiment is on the drum. Alternatively, in the image forming apparatus using an intermediate member, similar advantages are obtained even if a toner image is formed on the intermediate member, the amount of reflected light is analyzed, and the LUT is changed. Thus, this embodiment may be formed in such a configuration.

(Chromaticity Calculation Method during Full Calibration)

In the present invention, conversion to L*a*b* is made by a direct mapping method (similar to the ICC profile) by using the reader section. Of course, full calibration may be performed by calculating chromaticity using a spectrophotometer which is commercially available or by inputting data such that RGB→L*a*b* conversion is made using a commercially available scanner.

A user who is meticulous about color often creates a unique ICC profile and purchases a chromaticity meter for the purpose of managing stability of color. For such a user, a situation may occur in which a reader section is necessary although the copier function is not necessary. Recently, in particular, image output devices having mainly a printer function and no reader section are common, and it is preferable that a general-purpose external input I/F, such as RS232C and USB, be provided in the printer device so as to store chromaticity information. Such a configuration leads to the reduced cost of the reader section and the image processing section.

Furthermore, an environment is more preferable in which a general-purpose external I/F is provided in a copier machine having a reader so as to be capable of inputting an accurate chromaticity value.

The commercially available spectrophotometer calculates L*a*b* data from spectral reflectance, and the accuracy thereof is higher than the L*a*b* data for which direct mapping calculation is performed from RGB data.

Therefore, for the user who demands higher-accuracy calibration, the demand of the user can be met by performing calibration using a commercially available colorimeter.

The following is a method of calculating the chromaticity value (L*a*b*) from the spectral reflectance.

a. The spectral reflectance R(λ) of the specimen is determined (380 nm to 780 nm)

b. Color-matching functions x(λ), y(λ), and z(λ), and standard light spectrum distribution SD50(λ) are provided c. R(λ)×SD50(λ)×x(λ), R(λ)×SD50(λ)×y(λ), R(λ)×SD50(λ)×z(λ)

d. Each wavelength integration $$\Sigma\{R(\lambda)\times SD50(\lambda)\times x(\lambda)\}$$

$$\Sigma\{R(\lambda)\times SD50(\lambda)\times y(\lambda)\}$$

$$\Sigma\{R(\lambda)\times SD50(\lambda)\times z(\lambda)\}$$

e. Each wavelength integration of the product of color matching function y(λ) and standard light spectrum distribution SD50(λ)

$$\Sigma\{SD50(\lambda)\times y(\lambda)\}$$

f. XYZ calculation $$X=100\times\Sigma\{SD50(\lambda)\times y(\lambda)\}/\Sigma\{R(\lambda)\times SD50(\lambda)\times x(\lambda)\}$$

$$Y=100\times\Sigma\{SD50(\lambda)\times y(\lambda)\}/\Sigma\{R(\lambda)\times SD50(\lambda)\times y(\lambda)\}$$

$$Z=100\times\Sigma\{SD50(\lambda)\times y(\lambda)\}/\Sigma\{R(\lambda)\times SD50(\lambda)\times z(\lambda)\}$$

g. L*a*b* calculation $$L^*=116\times(Y/Yn)\hat{}(1/3)-16$$

$$a^*=500\{(X/Xn)\hat{}(1/3)-(Y/Yn)\hat{}(1/3)\}$$

$$b^*=200\{(Y/Yn)\hat{}(1/3)-(Z/Zn)\hat{}(1/3)\}\text{ when } Y/Yn>0.008856$$

When Y/Yn>0.008856, ⇓Xn, Yn, and Zn are standard light tri-stimulus values.

$$(X/Xn)\hat{}(1/3)=7.78(X/Xn)\hat{}(1/3)+16/116$$

$$(Y/Yn)\hat{}(1/3)=7.78(Y/Yn)\hat{}(1/3)+16/116$$

$$(Z/Zn)\hat{}(1/3)=7.78(Z/Zn)\hat{}(1/3)+16/116$$

It is common practice that x(λ), y(λ), and z(λ) are represented as $x(\bar{\lambda})$, and $y(\bar{\lambda})$, and $z(\bar{\lambda})$.

Figure 16:
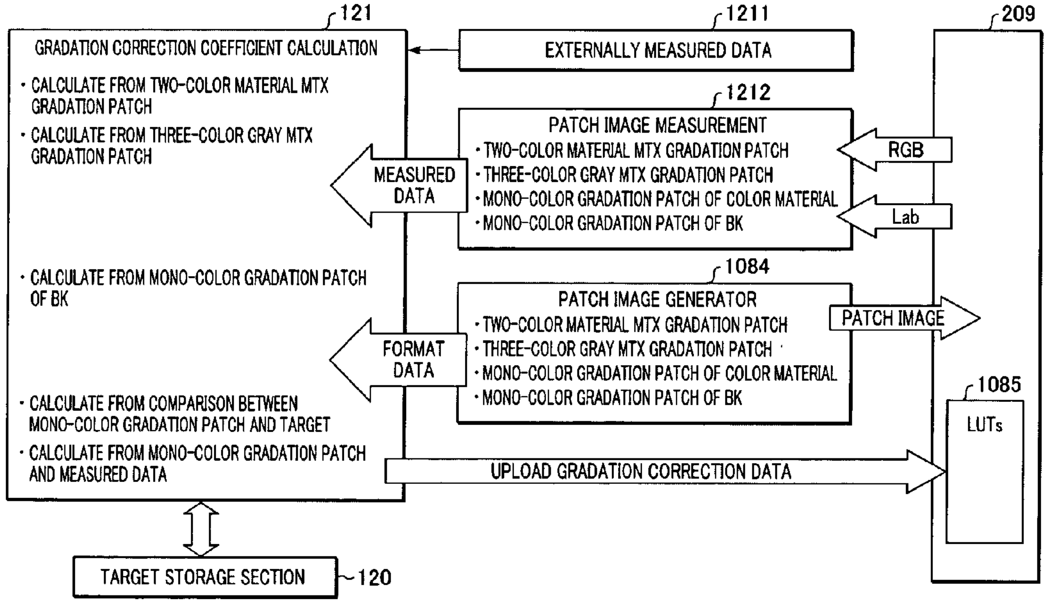
FIG. 16 collectively illustrates the embodiments of the present invention.

A description is given with reference to FIG. 16 in which the above-described embodiments of the present invention are collectively shown. In the figure, the flow of a signal and data is shown, and the control signal is not shown for the sake of simplicity. The same reference numerals are used through the embodiments. In the figure, reference numeral 1212 denotes a batch image measurement section, which is shown in such a manner as to be independent of the gradation correction coefficient calculation section 121, and reference numeral 1211 denotes measured data from, for example, the above-described commercially available spectrophotometer.

In FIG. 16, a patch image generator 1084 generates a patch image of the type shown in the figure, and a patch image measurement section 1212 measures an image of the format shown in the figure. A gradation correction calculation section 121 in the figure analyzes the measured data by using information of various kinds of format generated by the patch image generator, which is data associated with the measured data of the patch image measurement section 1212, for example, data indicating that the measured data of a certain patch corresponds to which level of the patch image signal. Instead of inputting the measured data, measured data for the image generated at the batch image generator 1084 may be input externally, gradation correction data for the LUT 1085 may be generated, and this may be uploaded to the LUT 1085.

The target storage section 120 stores the above-described target, external measured data, and measured data from the patch image measurement section 1212. The target data can be calculated from this stored data, so that the calculated target data is used for the gradation correction coefficient calculation section 12.

Furthermore, the gradation correction coefficient uploaded to the LUT may be stored, so that, in the fifth embodiment, the above-mentioned format data, which is converted using the stored gradation correction coefficient, can be used.

In the above description, the representation "LUT off" is made. It is clear that the state of the LUT off can be produced by uploading the data such that the conversion of the LUT is 1:1.

In the manner described above, a matrix patch of a secondary color which is output in a state in which the gradation correction table (hereinafter an LUT) is off is read, and the chromaticity is calculated. The calculated chromaticity is converted into hue and chroma information, and a combination in which the hue angle is constant and the chroma becomes linear at fixed intervals is calculated. The combination determined in such a manner is reflected in the LUT of the single color. On the other hand, regarding the gradation correction table of the color material, a matrix patch in which color materials of multiple colors are combined with the secondary color patch via the LUT for two colors, which is determined at first, is output, and a combination in which the three-color gray (achromatic color) and lightness are decreased at a fixed rate is calculated, creating the LUT of another color. If an output operation is performed at an image forming apparatus having such gradation characteristics, the above-described problems can be solved.

By performing each of the above-described embodiments, a combination in which full calibration for performing accurate matching of a secondary color and quick calibration for processing the state using single-color information becomes possible. Thus, it is possible to provide an image forming apparatus in which the user is able to make the selection of either higher accuracy or higher efficiency, which has high precision, and in which the ease of operation of the user can be improved.

In addition, when the construction is formed in such a way that color measurement value input from an external colorimeter is possible, a gradation correction table having high accuracy can be created without increasing the initial cost even for a printer which does not have a manuscript reading section. Therefore, improvement of the color matching accuracy and the improvement of gradation reproduction can be achieved.

As described above, an image formed on the basis of an image signal of matrix patches of a secondary color formed of color materials of two different colors is read to obtain measured results for each patch. A single-color gradation correction coefficient for a signal corresponding to each of the two color materials such that the measured results of the patch image formed by the patch image signal at the same level for the color materials of two different colors are the same hue and the chroma is proportional to the level of the patch image signal, is calculated. Then, the single-color gradation correction coefficient is reflected in the LUT for performing level conversion of the corresponding signal. As a result, it becomes possible to optimize the hue and chroma of the image formed on the basis of the equal-amount level of the two color materials. Furthermore, the measured results of the patch image formed in accordance with the signal such that a patch image signal of a plurality of gradations formed of the color materials of the color of the remaining colors is superposed onto the patch image signal of a plurality of gradations formed of an equal-amount of two different color materials, which are optimized, are obtained. The gradation correction coefficient for the signal corresponding to the color materials of the remaining colors is calculated, and is finally reflected in the LUT. Therefore, at the same time, the optimization for the gray color formed of at least three different colors can be achieved.

In other words, it is possible to provide an image forming apparatus in which color matching accuracy is improved and gradation reproduction is improved with regard to a color formed of an equal-amount level of two different color materials and a gray color formed of an equal-amount level of at least three different color materials.

Furthermore, it is possible to provide an image processing apparatus which is capable of causing an image forming apparatus to make an output such that color matching accuracy is improved and gradation reproduction is improved with regard to a color formed of an equal-amount level of two different color materials and a gray color formed of an equal-amount level of at least three different color materials.

Additional Embodiments

The present invention can also be achieved in such a manner that storage medium (or a recording medium) on which program code of software which realizes the functions of the above-described embodiments is supplied to a system or an apparatus, and the computer (or the CPU or MPU) of the system or the apparatus reads the program code stored on the recording medium, and executes it. In this case, the program code itself read from the storage medium realizes the functions of the above-described embodiments. The program code can be written into various storage media such as a CD, an MD, a memory card, and/or an MO disk.

Furthermore, beside the above-described functions of the above-described embodiments are realized by executing the program code which is read by the computer, the present invention includes a case where the operating system (OS) running on the computer performs the entirety or part of the processes in accordance with instructions of the program code, thereby realizing functions of the above-described embodiments.

Furthermore, the present invention also includes a case where, after the program code read from the storage medium is written in a function expansion card which is inserted into the computer or in a memory provided in a function expansion unit which is connected to the computer, the CPU or the like contained in the function expansion card or the function expansion unit performs the entirety or part of the processes in accordance with instructions of the program code, thereby realizing the functions of the above-described embodiments.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image processing apparatus for forming an image using three or more color materials, said image processing apparatus comprising:

first generation means for generating a plurality of patches of secondary colors composed of two different color materials;

first measurement means for measuring said patches;

first correction characteristic calculation means for calculating gradation-correction characteristics corresponding to said two different color materials such that said secondary colors are in a predetermined relationship on a basis of measured results of said first measurement means, wherein said predetermined relationship comprises a relationship in which the secondary colors of the plurality of patches have approximately the same hue, and the secondary color of each of the plurality of patches has a chroma that is linearly related to a chroma associated with respective image signals that correspond to each of the plurality of patches;

second generation means for generating a group of patches in accordance with an image signal corrected on a basis of said gradation-correction characteristics, being calculated on a basis of measured results of said first measurement means, for said two different color materials and an image signal for a color material other than said two different color materials;

second measurement means for measuring patches generated by said second generation means; and second correction characteristic calculation means for calculating gradation-correction characteristics of said image signal for said color material other than said two different color materials on a basis of measured results of said second measurement means.

2. An image processing apparatus according to claim 1, wherein said two different color materials are magenta and yellow.

3. An image processing apparatus according to claim 1, wherein said two different color materials can be selected from at least three color materials.

4. An image processing apparatus according to claim 1, wherein said second correction characteristic calculation means calculates gradation-correction characteristics of an image signal for color materials other than said two different color materials in order to reproduce an achromatic color.

5. An image processing apparatus according to claim 1, further comprising storage means for storing a target of a single color with respect to each of said three or more color materials, wherein calibration is performed using said single-color target at predetermined intervals.

6. An image processing method for forming an image using at least three color materials, said image processing method comprising the steps of:

generating a plurality of patches of secondary colors composed of two different color materials;

measuring said patches;

calculating gradation-correction characteristics corresponding to said two different color materials such that said secondary colors are in a predetermined relationship on a basis of measured results of said measuring of said patches, wherein said predetermined relationship comprises a relationship in which the secondary colors of the plurality of patches have approximately the same hue, and the secondary color of each of the plurality of patches has a chroma that is linearly related to a chroma associated with respective image signals that correspond to each of the plurality of patches;

generating a group of patches in accordance with an image signal corrected on a basis of said gradation-correction characteristics, being calculated on a basis of measured results of said measuring of said patches, for said two different color materials and an image signal for a color material other than said two different color materials;

measuring said group of patches; and calculating gradation-correction characteristics of said image signal for said color material other than said two different color materials on a basis of measured results of said measuring of said group of patches.

7. A computer-readable recording medium storing a computer-executable program for causing a computer to realize an image processing method for forming an image using at least three color materials, said image processing method comprising the steps of:

generating a plurality of patches of secondary colors composed of two different color materials;

measuring said patches;

calculating gradation-correction characteristics corresponding to said two different color materials such that said secondary colors are in a predetermined relationship on a basis of measured results of said measuring of said patches, wherein said predetermined relationship comprises a relationship in which the secondary colors of the plurality of patches have approximately the same hue, and the secondary color of each of the plurality of patches has a chroma that is linearly related to a chroma associated with respective image signals that correspond to each of the plurality of patches;

generating a group of patches in accordance with an image signal corrected on a basis of said gradation-correction characteristics, being calculated on a basis of measured results of said measuring of said patches, for said two different color materials and an image signal for a color material other than said two different color materials;

measuring said group of patches; and calculating gradation-correction characteristics of image signal for said color material other than said two different color materials on a basis of measured results of said measuring of said group of patches.

* * * * *